United States Patent [19]
Kumihashi et al.

[11] Patent Number: 5,242,539
[45] Date of Patent: Sep. 7, 1993

[54] PLASMA TREATMENT METHOD AND APPARATUS

[75] Inventors: Takao Kumihashi, Kokubunji; Kazunori Tsujimoto, Higashi-yamato; Shinichi Tachi, Sayama; Masafumi Kanetomo, Tokyo; Junichi Kobayashi, Ushiku; Tatehito Usui, Ibaraki; Nobuyuki Mise, Chiyodacho-inayoshi, all of Japan

[73] Assignee: Hitachi, Ltd., Tokyo, Japan

[21] Appl. No.: 859,336

[22] Filed: Mar. 27, 1992

[30] Foreign Application Priority Data

Apr. 4, 1991 [JP] Japan .................................. 3-071464
Jan. 13, 1992 [JP] Japan .................................. 4-003675
Mar. 26, 1992 [JP] Japan .................................. 4-068098

[51] Int. Cl.$^5$ .............................................. B44C 1/22
[52] U.S. Cl. .................................... 156/643; 156/345
[58] Field of Search ............ 156/643, 646, 345; 118/715, 719, 723, 724, 728, 729, 730, 50, 50.1, 620; 204/192.32, 298.07, 298.33, 298.38

[56] References Cited

U.S. PATENT DOCUMENTS

| | | | |
|---|---|---|---|
| 4,339,326 | 7/1982 | Hirose et al. | 204/298.38 |
| 4,462,863 | 7/1984 | Nishimatsu et al. | 204/298.38 |
| 4,842,683 | 6/1989 | Cheng et al. | 204/298.33 |
| 4,985,109 | 1/1991 | Otsubo et al. | 156/345 |

FOREIGN PATENT DOCUMENTS

| | | |
|---|---|---|
| 272140 | 6/1988 | European Pat. Off. |
| 407169 | 1/1991 | European Pat. Off. |
| 52-126174 | 10/1977 | Japan |
| 2-052428 | 2/1990 | Japan |
| 3-062517 | 3/1991 | Japan |

OTHER PUBLICATIONS

Perry, et al, "The Application of the Helicon Source to Plasma Processing." J.Vac.Sci.Technol.B 9 (2) Mar.-/Apr. 1991.

Sekine, et al, "Highly Selective Etching of Phosphorus-Doped Polycrystalline Silicon . . ." 1988 Dry Process Symposium, pp. 54–57.

Samukawa, "Perfect Selective, Highly Anisotropic, . . . " Extended Abstracts of the 22nd (1990 International) Conference on Solid State Devices and Materials, Sendai, pp. 207–210.

McNevin, "Radio Frequency Plasma Etching . . . " J.Vac.Sci.Technol B 8 (6) Nov./Dec. 1990 pp. 1185-1191.

McNevin, "Radio Frequency Plasma Etching of Si/-SiO$_2$ by Cl$_2$/O$_2$: Improvements Resulting from the Time Modulation of the Processing Gases", Journal of Vacuum Science and Technology, B8 (6), Nov./Dec. 1990, pp. 1185–1191.

Takahashi et al, "An Electron Cyclotron Resonance Plasma Deposition Technique Employing Magnetron Mode Sputtering", Journal of Vacuum Science and Technology, A6 (4), Jul./Aug. 1988, pp. 2348-2352.

Nishioka et al, "Effects of Plasma Parameters on Etching Characteristics with ECR Plasma", Microelectronic Engineering, vol. 9, 1989, pp. 481-484.

*Primary Examiner*—William A. Powell
*Attorney, Agent, or Firm*—Fay, Sharpe, Beall, Fagan, Minnich & McKee

[57] ABSTRACT

A plasma treatment method and apparatus utilize various gas inlet and outlet structure arrangements to optimize treatment characteristics for a semiconductor wafer. A buffer zone is created between gas inlets and the discharge zone of the vacuum treatment chamber to enhance uniformity of gas flow. The evacuation arrangement enables reactant gas to be exhausted uniformly to reduce gas residence time below a threshold while maintaining optimum flow rates and etch uniformity at low effective exhaust speeds.

76 Claims, 18 Drawing Sheets

PLASMA TREATMENT METHOD AND APPARATUS

BACKGROUND OF THE INVENTION

1. Field of the Invention

The present invention relates to a plasma treatment method and apparatus for treating a body, and more particularly to a plasma treatment method and apparatus for forming fine and deep trenches and holes in a semiconductor wafer.

2. Description of the Related Art

Both dry etching and wet etching techniques have been used in the past for treating semiconductor wafers. By comparison, however, dry etching techniques permit easier microfabrication, and they have thus found wider use in the manufacture of large-scale integrated circuits (LSIs).

An example of a conventional dry etching technique is the reactive ion etching (RIE) method, which requires a gas pressure of 10 mTorr to 100 mTorr, and a reaction gas flow of 10 sccm to 100 sccm for effective gas etching. In such an RIE method, a lower gas pressure than described results in unstable discharges, while a higher gas pressure than described results in an isotropic etching. Often, such systems include pumps for evacuating reactive gas at an evacuation rate of less than 1000 l/sec.

Japanese Laid-Open Publication No. 52-126174, and Samukawa, "Perfect Selective, Highly Anisotropic, and High Rate ECR Plasma Etching for N+ Poly-Si and WSi$_x$/Poly-Si," *Extended Abstracts of the 22nd (1990 International) Conference on Solved State Devices and Material*, pages 207-210, disclose a microwave plasma etching (ECR) technique. RIE dry etching systems are described in Sekime, et al, "Highly Selective Etching of Phosphorus-Doped Polycrystalline Silicon at Low Wafer Temperature Employing Magnetron Plasma," 1988 *Dry Process Symposium* (pages 54-57), and Perry, "The Application of the Helicon Source to Plasma Processing," *J. Vac. Sci. Technol.*, B9(2), March/April 1991 (pages 310-317). These dry etching machines provide a reaction gas pressure of more than 0.5 mTorr in a gas flow of less than 20 sccm. The etching speed achieved by these systems is about 300 nm/min in the case of ECR etching with a polycrystalline silicon, a chlorine gas as a reaction gas, a gas pressure of 0.5 mTorr and a gas flow of 20 sccm.

An illustrative example of a conventional dry etching machine of the microwave plasma type is shown in FIG. 16. Reference numeral 101 represents a microwave source, 102 a waveguide, 104 a gas inlet, 105 a gas pipe, 106 a gas flow rate controller, 107 a solenoid coil, 109 a wafer, 110 a sample stage and 111 a vacuum chamber, whose pressure is lowered by a vacuum pump 114. RF power supply 112 and discharge zone 117 are further shown.

Microwaves generated by the microwave source 101 are introduced through the waveguide 102 into the discharge zone 117, where the reaction gas is converted into plasma, which in turn etches the surface of the wafer 109 placed on the sample stage 110. In this dry etching system, one kind of gas is introduced into the discharge zone 117 through one gas pipe 105 and one gas flow rate controller 106. The gas pipe 105 is directly connected to the discharge zone 117. The area of the opening portion of the gas inlet 104 is about the same as the cross-sectional area of the gas pipe 105.

The gas pressure in the vacuum chamber 111 rises as the flow rate of the reaction gas increases, and lowers as the effective speed of evacuating the vacuum chamber 111 by the vacuum pump 114 increases. For a gas pressure of more than 1 mTorr, the gas flow rate is set at several tens of sccm; for a low gas pressure region at 0.1 mTorr, the flow rate is set at several sccm. The effective speed of exhaust is determined by the pumping speed of the vacuum pump 114 and the conductance of the evacuation system for the vacuum chamber 111. Conventional systems have an effective exhaust speed of 400 l/sec or less.

The pressure in the vacuum chamber is related to the gas flow as follows:

$$P = (q + Q)/S \qquad (1)$$

where P (in Torr) represents the pressure in the vacuum chamber, q represents the leak rate from the equipment when no gas is introduced, Q represents the flow rate of gas introduced (Torr·l/sec), and S represents the effective evacuation speed of the equipment (l/sec). Normally, q is less than 1/1000 of Q and almost negligibly small.

Conventional systems have a turbomolecular pump with an exhaust speed ($S_i$) of about 1000 l/sec or less and an exhaust conductance of the vacuum chamber (C) of between 200 l/sec and 1000 l/sec. The effective speed of exhaust S for a system having n such turbomolecular pumps is given by:

$$\frac{1}{S} = \frac{1}{\sum_{i=1}^{n} S_i} + \frac{1}{C} \qquad (2)$$

These conventional systems have been capable of performing evacuation at an effective exhaust speed of 100 to 400 l/sec. Hence, the flow rate of gas that can be achieved when the gas pressure is set at 0.5 mTorr is 4 to 20 sccm.

The residence time for a gas to stay in the vacuum chamber, which is a measure of ease with which the gas can flow in the vacuum chamber, is expressed by:

$$\tau = \frac{V}{S} = \frac{PV}{Q} \qquad (3)$$

where V is the total volume of the vacuum chamber. In these conventional systems, since the effective gas exhaust rate is 100 to 400 l/sec and the vacuum chamber volume is 100 to 300 l, the gas residence time is about 400 msec to 3 sec.

As LSIs become smaller and smaller, there are growing demands for development of a fabrication technology to form grooves and holes of about 0.3 μm in size. With dry etching systems using the conventional RIE, it is difficult to form fine grooves and holes with high precision because the high gas pressure causes scattering of ions in the gas plasma, disturbing the direction in which the ions strike the substrate.

By lowering the gas pressure in the vacuum chamber, it is possible to prevent the scattering of ions that are incident on the sample. To perform an anisotropic fabrication of grooves and holes of the above-mentioned size, it is necessary to limit the angle of incidence of ions striking the sample to less than 1°, and the gas pressure in the vacuum chamber to less than 1 mTorr, and preferably less than 0.5 mTorr. To keep the plasma discharges stable requires a pressure of at least 0.01 mTorr.

Such conventional dry etching systems having low gas pressures include ECR etching systems, magnetron discharge RIE systems and helical resonator discharge RIE systems. These conventional systems, however, have a problem in that lower gas pressure results in reduced etching rate. In other words, increasing the etching directionality and heightening the etching speed are two conflicting requirements that have been difficult to meet at the same time.

Meanwhile, diameters of silicon wafers for LSIs are increasing. The ECR etching systems of the prior art use a single wafer system in which wafers are carried to the vacuum chamber one at a time for etching With such equipment, it takes about one to two minutes to reduce the thickness of a 6-inch polysilicon wafer by 200 nm at an etching speed of 200 to 300 nm/min. When an 8-inch wafer is used, the etching speed decreases due to an etching area dependency (loading effect), prolonging the processing time to two and four minutes and deteriorating the throughput.

The throughput may be improved by raising the etching speed by increasing the input power of the high frequency or microwave source. However, this gives rise to another problem in that increased ion energy reduces selectivity. While it is impossible to improve throughput without changing the etching conditions by using a plurality of signal-wafer-system dry etching systems for parallel processing, the equipment cost becomes prohibitively high.

The above ECR etching systems have another drawback. The cross-sectional area of the opening portion of the gas inlet is small. When the effective gas exhaust rate is set higher than that of the conventional systems to increase the flow rate of gas flowing in the vacuum chamber 111 to more than 1300 l/sec, for example, the velocity of the gas flowing from the gas inlet 104 into the vacuum chamber 111 approaches the speed of sound, causing shock waves in the gas flow, which in turn makes the pressure in the flow uneven. Under such conditions, not only is the gas density over the sample not uniform, but the distribution of plasma produced by discharge becomes nonuniform and unstable, the degrading of the uniformity of the etching speed. Hence, the gas flow speed should be set to below the sonic speed, or preferably one-third the sonic speed.

In an equipment configuration such as is shown in FIG. 16, wherein the gas inlet 104 is located near the side of the sample stage 110, which defines the gas outlet for the discharge zone 117, the gas flowing from the gas inlet 104 toward the discharge zone 117 is evacuated from the outlet before it can disperse in the entire space of the discharge zone 117. As a result, the gas is not effectively utilized. Moreover, depending on the shape of the discharge zone, the gas flow may fail to disperse sufficiently over the central area of the discharge zone 117.

Since only one gas flow rate controller 106 and one gas pipe 105 are commonly used for supplying one kind of gas, a deviation occurs with the gas flow and the discharge zone 117 with respect to the uniformity of etching.

A further problem with conventional systems is that, as the wafer diameter increases, it becomes increasingly difficult for the gas flow to disperse sufficiently to cover the central area of the discharge zone 117.

SUMMARY OF THE INVENTION

An object of the present invention is to provide a plasma treatment method and a plasma treatment system that is capable of etching fine grooves and holes with high precision and high speed.

Another object of the invention is to provide a plasma treatment method and a plasma treatment system having a large throughput.

A further object of the invention is to provide a plasma treatment method and a plasma treatment system having high anisotropy.

A further object of the invention is to provide a plasma treatment method and a plasma treatment system capable of achieving high selectivity of etch.

A further object of the invention is to provide a plasma treatment method and a plasma treatment system which is capable of achieving a high etching speed or etch rate of greater than 50 nm/min, preferably as high as 1000 nm/min, at a low gas pressure of less than 5 mTorr, and preferably less than 0.5 mTorr.

A further object of the invention is to provide a plasma treatment method and a plasma treatment system capable of good uniformity of etching speed.

A further object of the invention is to provide a plasma treatment method and a plasma treatment apparatus which cause less contamination due to re-adhesion of reaction products on treated body surfaces and the treatment chamber's inner walls.

The above objects, and other objects, can be achieved, first, by setting the gas pressure in the vacuum treatment chamber at 5 mTorr or less, and preferably 1 mTorr or less; and by having a 300 msec or less reaction gas residence time at an effective exhaust speed of at least 500 l/sec, and preferably a 100 msec or less reaction gas residence time at an effective exhaust speed of at least 1300 l/sec.

FIG. 33 shows a representation of effective exhaust speed, gas pressure regulating range and effectiveness of the invention. As mentioned before, gas pressure is the parameter which regulates the etching directionality property (anisotropy), while the exhaust speed is the parameter which regulates etch speed. Previously in etching, exhaust speeds were low, with effective exhaust speeds of about 400 l/sec or below, so that even for a high density plasma etching device, such as a microwave etching device, there was a problem with achieving high etch speed and high anisotropic processing, because the selectivity ratio with regard to the mask was small, even when the incident particles' directional properties were orderly at low gas pressures.

A major scope of application of the invention can be divided into three areas, as shown in FIG. 33. These areas are: (1) to increase etch speed—regardless of the gas pressure area—by a moderate 1.5 or more times over conventional levels, i.e., requiring 800 l/sec or more effective exhaust speed; (2) to increase the etch speed a moderate 1.5 or more times over conventional levels, and to increase the anisotropy a moderate 1.5 or more times over conventional levels, i.e., requiring 500 l/sec or more effective exhaust speed and 5 mTorr or less gas pressure; and (3) to at least double the conventional effective exhaust speed, and to increase the anisotropy to at least double that of conventional levels, i.e., requiring 1300 l/sec or more effective exhaust speed, and 1 mTorr or less gas pressure.

From the standpoint of improving the process, method (3) is optimal. However, since there are various processing procedures in semiconductor manufacture and equipment costs to be taken into consideration, application of methods (1) and (2) are feasible for obtaining the required quality at low cost.

In the above-mentioned equation (1), the relationship among gas pressure P, exhaust speed S, and gas flow rate Q is expressed as $P=Q/S$. So, in order to satisfy the above-mentioned criteria, the required gas flow rate is 32 sccm, for a minimum gas pressure of 0.5 mTorr, and the effective exhaust speed is 800 l/sec. However, 40 sccm or more is preferably, taking fluctuations into account, since in reality gas pressure is precisely regulated.

Here, since the discharge becomes unstable at 0.01 mTorr or less gas pressure, it is preferable that the lower limit of the gas pressure exceed 0.01 mTorr.

Also, the effective exhaust speed, even at maximum, should not exceed 100,000 l/sec, taking the size of the apparatus into consideration.

Gas residence time should be 0.1 msec or more, taking into account the capacity of the vacuum treatment chamber, the upper limit of the above-mentioned effective exhaust speed, and the etching surface's reaction time.

Also, the gas flow rate should not exceed 10,000 sccm, taking gas usage cost and flow regulation into consideration.

The above and other objectives can further be achieved effectively by increasing the effective cross-sectional area of the gas inlet to lower the incoming gas flow speed below one-third the speed of sound in the vacuum chamber; providing a buffer zone by providing a partition including a plurality of meshlike small holes between the gas inlet and the plasma treatment, or discharge, zone; arranging the gas outlet close to the sample stage while setting the gas inlet mounting position in the vacuum chamber away from the sample stage and directing the gas introduced through the gas inlet toward the center of the vacuum chamber or of the discharge zone; and mounting a plurality of gas pipes and gas inlets around the vacuum chamber or discharge zone in a symmetrical arrangement. Moreover, the gas pipes and gas inlets can be used to introduce gas having a flow rate controlled by a gas flow rate controller.

Additionally, the above objectives are achieved by providing a shield in the vacuum chamber that controls the flow of gas in the vacuum chamber; setting the height-width ratio of the discharge zone at more than 0.5; locating the gas inlet within the top one-third of the height of the discharge zone; providing an exhaust buffer zone between the exhaust system and the discharge zone; and setting the pump evacuation speed to be greater than 2500 l/sec, and preferably greater than 4000 l/sec, with an exhaust conductance of more than 2000 l/sec and preferably greater than 3000 l/sec, to achieve an exhaust speed of greater than 1300 l/sec.

The above objectives are also achieved by setting the time that the reaction gas stays in the vacuum chamber to be less than 300 msec (preferably less than 100 msec) by using a large vessel and performing batch processing on a number of large-diameter wafers.

The above objectives are further achieved by providing a gas outlet at the center of the sample stage in a large vessel; increasing the gas flow introduced into the large vessel beyond 10 sccm; setting the area of an electrode that forms the sample stage to more than 5000 $cm^2$; setting the overall exhaust conductance of the vacuum chamber to more than 3300 l/sec; using a vacuum pump with a pumping speed of greater than 5000 l/sec; and setting the effective gas exhaust rate to greater than 2000 l/sec.

DETAILED DESCRIPTION OF THE PREFERRED EMBODIMENTS

With conventional dry etching systems, lowering the gas pressure results in a significant reduction in etching speed, making it impossible to obtain a useful etching speed. This is possibly due to the fact that the lower gas pressure reduces the amount of reaction gas in the vacuum chamber.

In studies made by the present inventors, it was found that when the reaction gas first strikes the sample to be etched, etching takes place. In other words, if a greater amount of unreacted reactive gas is present in the reaction chamber than reacted gas (reaction product), the etching speed or etch rate can be increased without changing the gas pressure.

Figure 5:
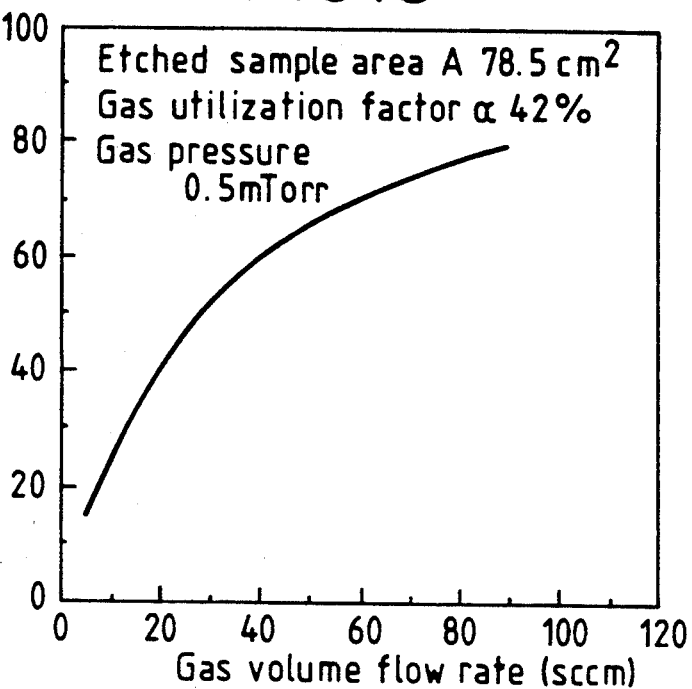
FIG. 5 shows a graph of the ratio of reactive gas to total incident gas including reaction products striking the substrate when the gas flow rate is varied.

FIG. 5 illustrates the ratio of a gas incident on a substrate to the sum of reactive gas and total incident particles (reactive gas plus reaction product) with a changing gas flow rate. The gas incident ratio is given by:

$$R = 1/(1 + 2.735 \times 10^2 \, C_1 \cdot A \cdot P/(\alpha \cdot Q)) \quad (4)$$

wherein $C_1$ is a constant determined by the etched material and the etching gas and has a range between 0.1 and 10; A is an area to be etched; P is a gas pressure; $\alpha$ is a gas utilization factor, a constant ranging from 10 to 100% that is determined by the discharge efficiency of the introduced gas in the etching machine and the shapes of the vacuum chamber and discharge zone; and Q is a gas flow rate.

FIG. 5 shows the result of calculations assuming the etching area A to be 78.5 cm$^2$, $\alpha$ to be 42%, and P to be 0.5 mTorr. The figure shows that the ratio of the reactive gas increases with the gas flow rate.

Figure 6:
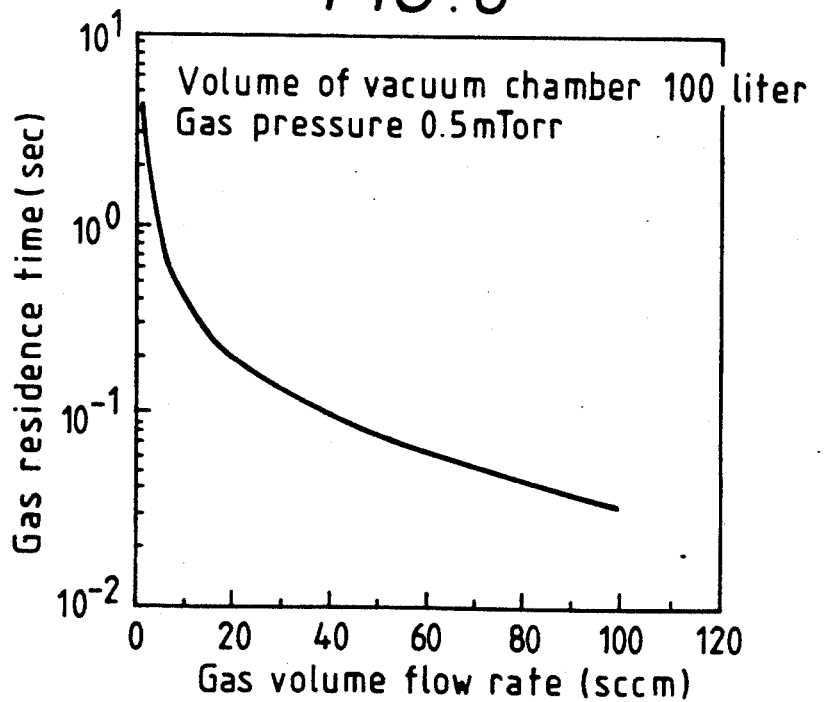
FIG. 6 is a graph showing the residence time when the gas flow rate is varied.

FIG. 6 shows the result of calculating changes in the time that the gas stays in the vacuum chamber by using equation (3) when the flow rate is varied with the gas pressure kept constant. As the gas flow rate increases, the gas residence time sharply decreases. Therefore, as the gas flow rate increases, the time that the reaction product stays in the vacuum chamber decreases, causing the reaction products to be exhausted swiftly from the vacuum chamber, promoting the etching reaction to increase the etch rate.

Figure 17:
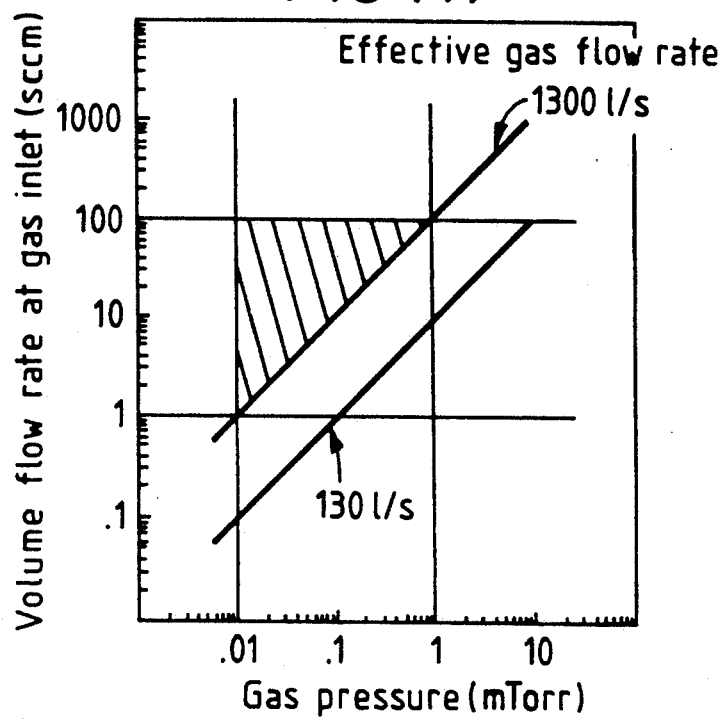
FIG. 17 is a graph showing the relationship between gas pressure and gas flow rate at different effective exhaust speeds.

However, when the gas flow rate is increased without changing the equipment configuration, since the effective gas exhaust rate is constant, the gas pressure increases as shown in FIG. 17, deteriorating the anisotropy. The greater the effective gas exhaust rate, the higher the gas flow rate and the gas inlet under the same gas pressure. In other words, by increasing the effective gas exhaust rate, it is possible to increase the gas flow rate at the same gas pressure.

Figure 7:
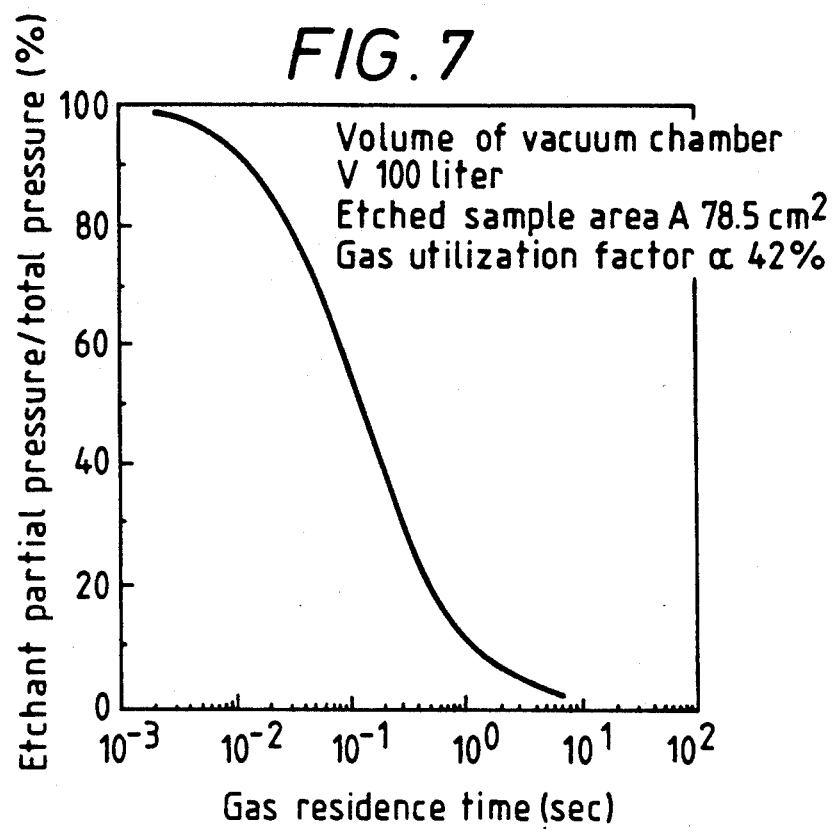
FIG. 7 shows a graph of reactive gas to total incident gas including reaction products striking the substrate when the gas residence time is varied.

FIG. 7 shows the relationship between the ratio of reactive gas to total incident particles and the gas residence time in the vacuum chamber, by using equations (3) and (4). The calculation assumes that the total volume of the vacuum chamber is 100 l, A equals 78.5 cm$^2$, and $\alpha$ equals 42%.

FIG. 7 indicates that, as the gas residence time decreases, the ratio of reactive gas increases, showing a significant change during a period between 1 sec and 100 msec. It follows therefore that to perform the etching reaction efficiently requires the gas flow rate to be set higher than 40 sccm, and preferably higher than 100 sccm, from FIG. 5, and the gas residence time to be set lower than 100 msec, and preferably lower than 50 msec, from FIG. 7, when the ratio of the reactive gas to the total wafer incident particles is taken to be more than 60%.

When the volume of the vacuum chamber is less than 100 l, the above gas residence time can be achieved by setting the flow rate of gas flowing in the chamber at more than 1300 l/sec. Setting the effective opening area of the gas inlet to 150 cm$^2$ by means of a partition including the plurality of meshlike small holes to form a buffer zone reduces the gas flow speed at the gas inlet to less than one-third the speed of sound, preventing the gas from forming a high-speed flow. This in turn suppresses the shock waves accompanying the gas flow, thereby reducing the instability and nonuniformity of the plasma.

Since the gas inlet is installed remote from the side portion of the sample stage, which forms a gas outlet for the discharge zone, the gas flow is able to disperse sufficiently in the discharge zone, efficiently transforming the gas into plasma and therefore increasing the etch rate and uniformity. Further, since the gas inlet is directed toward the center of the vacuum chamber or discharge zone, a sufficient amount of gas can flow toward the center of the vacuum chamber or discharge zone, in turn resulting in improved speed and uniformity of etching.

Arranging the gas pipes, through which gas flow is controlled by a gas flow rate controller, around the vacuum chamber or discharge zone in symmetry has made possible the prevention of deviation of gas flow in the vacuum chamber or discharge zone. This improves the uniformity of etching as well. Installation of the gas inlets also takes symmetry into account, so that gas flow uniformity is further improved.

Provision of a shield enables a control of gas flow in the vacuum chamber. In particular, the shield enables the character of the gas flow to be adjusted where the plasma is generated, increasing the etch rate.

Figure 15:
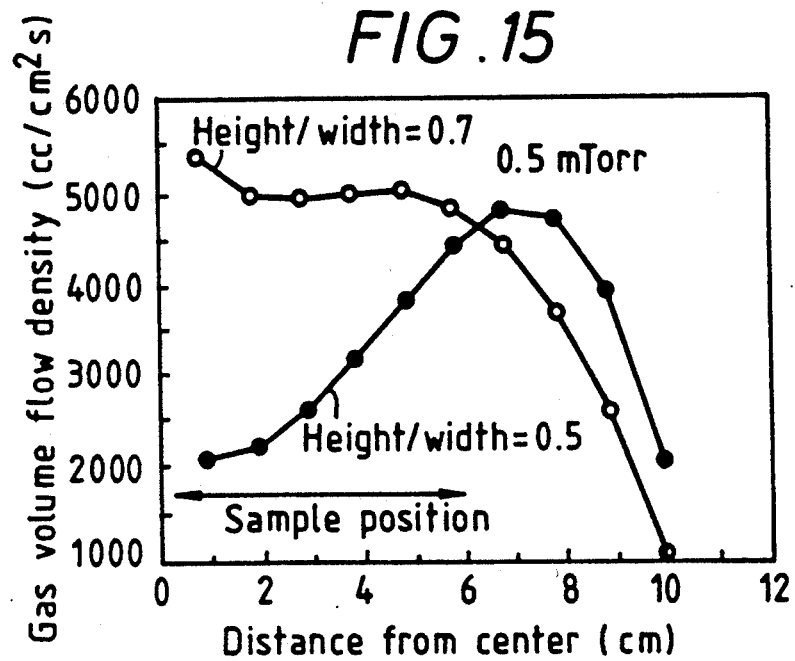
FIG. 15 illustrates a simulation of the relationship between the ratio of height to width of the discharge zone and the density of gas flow in the discharge zone.

By setting the height-width ratio of the discharge zone to greater than 0.5, a sufficient amount of gas flows to the center of the discharge zone. With reference to FIG. 15, increasing the height-width ratio of the discharge zone increases the gas flow density above the wafer located at the center of the discharge zone, improving gas flow uniformity. In this way, the invention enables the gas to flow efficiently and evenly through the center of the discharge zone, thereby increasing plasma density and uniformity. As a result, it has become possible to perform etching a high speed and good uniformity.

In dry etching systems, the lower the gas pressure, the smaller the frequency that the ions coming from the plasma and impinging on the wafer are scattered, and the higher the etching anisotropy. According to the present invention, it is possible to perform low-pressure anisotropic etching with good uniformity at a practical etch rate.

Using a large vessel in a dry etching process, a large number of samples can be processed at one time, improving throughput. When a large vessel is used, it is particularly important to exhaust the reaction products generated as a result of the etching reaction out of the vessel. This requires a high-speed evacuation.

Conventional systems commonly have a turbomolecular pump with a pumping speed $S_0$ of about 1000 l/sec or less. For an exhaust conductance of 200 l/sec to 1000 l/sec, the effective evacuation speed S is 100 to 400 l/sec. Hence, when the gas pressure is set at 5 mTorr, the gas flow rate that can be achieved is 40 to 200 sccm. Because of the above-mentioned high-speed vacuum pump and large exhaust conductance, the present invention achieves a gas flow rate of 800 sccm at 5 mTorr by setting the effective evacuation speed to at least 1300 l/sec, and preferably at least 2000 l/sec.

Figure 18:
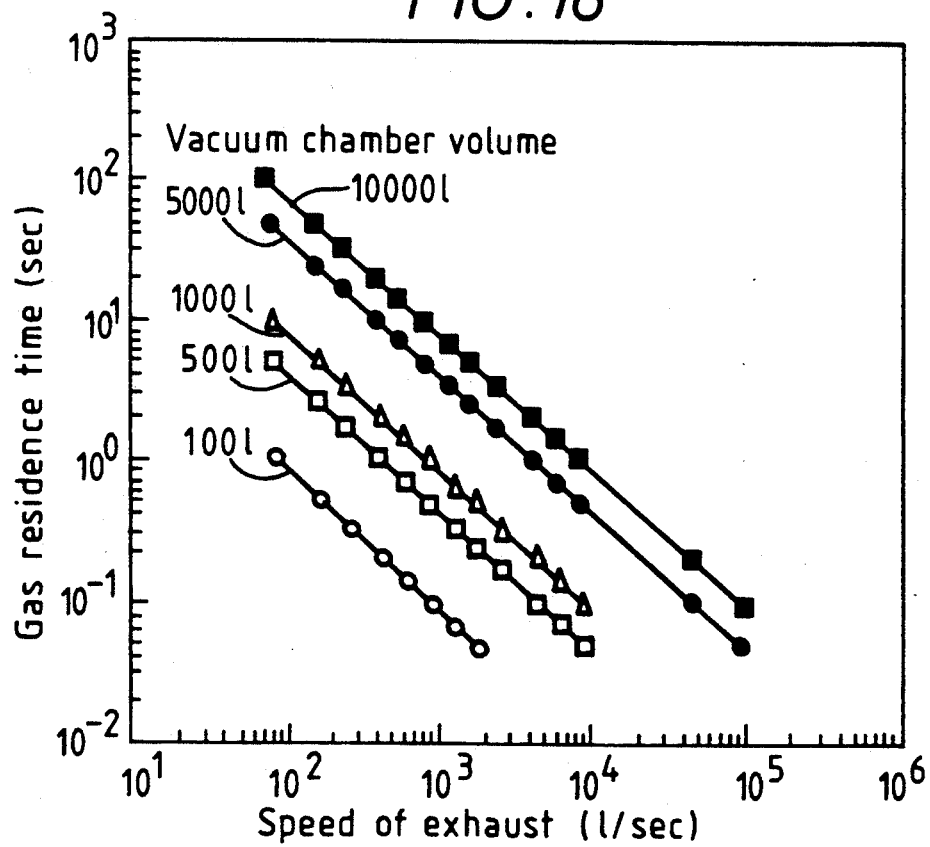
FIG. 18 is a graph showing the relationship between effective exhaust speed and gas residence time with the vacuum chamber volume taken as a parameter.

FIG. 18 shows the relationship between effective exhaust speed and gas residence time when the vacuum chamber volume changes from 100 l to 10,000 l. The gas residence time can be made shorter than 100 msec by setting the effective exhaust speed to more than 700 l/sec for the vacuum chamber volume of 100 l, to more than 3600 l/sec for a vacuum chamber volume of 500 l, and to more than 70,000 l/sec for a vacuum chamber volume of 10,000 l. For example, to achieve an effective exhaust speed of 70,000 l/sec requires, from equation (2), the use of a vacuum pump having a pumping speed of 140,000 l/sec and a vacuum chamber having an exhaust conductance of 140,000 l/sec.

By providing a gas outlet at the center of the sample stage, the density of gas at the center and around the sample stage can be made uniform.

Furthermore, by providing the wafer support at a point distant from the ECR point results in greater uniformity of etch as well.

In view of the foregoing discussions, the preferred embodiments of the invention will be discussed.

Figure 1:
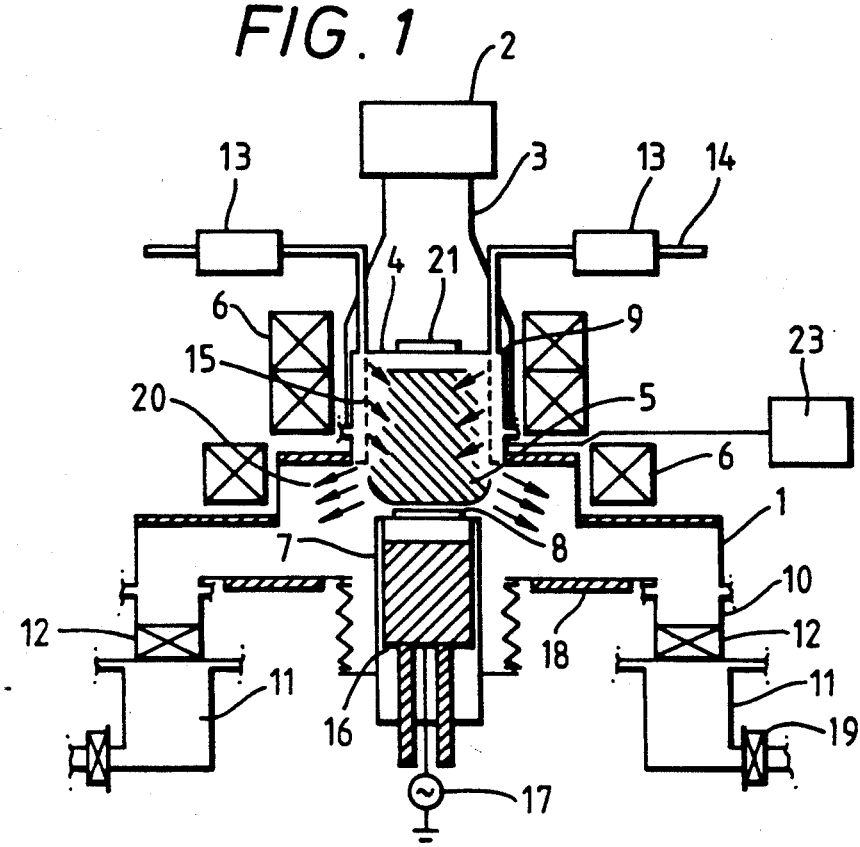
FIG. 1 illustrates a simplified cross-section of a microwave plasma etching machine of a high-vacuum, high speed exhaust type constructed according to the teachings of the present invention.

A preferred embodiment of a high-speed exhaust plasma treatment system is shown in FIG. 1. Sample stage 7 is illustratively shown supporting a semiconductor wafer 8 within vacuum chamber 1. The region above sample stage 7 within vacuum chamber 1 is defined as the discharge zone 4, into which an etching gas is introduced via gas pipes 14, associated gas flow rate controllers 13, gas inlet 9, and buffer zone 15. A gas plasma is produced from the etching gas through the use of a microwave source 2, which preferably generates a frequency of microwave radiation of approximately 2.45 GHz, and propagates the microwave radiation through a waveguide 3 into discharge zone 4. Gas pressure may be monitored by a gas sensor 23 at the discharge zone. For effective discharge, a field generation solenoid coil 6 is arranged around the discharge zone so that a magnetic field of 875 Gauss is generated in the discharge zone to produce a high-density plasma by electron cyclotron resonance (ECR). Only one sample stage 7 and wafer 8 are shown, but a plurality of such sample stages as well as a plurality of wafers per sample stage may be provided.

After etching the semiconductor wafer, used etching gas plasma is exhausted from the vacuum chamber 1 via an exhaust buffer zone 10 by a vacuum pump 11. A variable conductance valve 12 is provided to vary the exhaust rate as a means of optimizing the etch rate in the vacuum chamber.

Vacuum pump 11 preferably includes two turbomolecular pumps having a pumping speed of 2000 l/sec each for a total exhaust speed of 4000 l/sec. Exhaust buffer zone 10, which is essentially a gas exhaust outlet in the vacuum treatment chamber, is preferably installed symmetrically with respect to the central axis of the wafer. This enables the gas flow to be symmetrical to the center of the wafer, while greatly increasing the exhaust conductance. The twin turbomolecular pumps are preferably arranged symmetrically with respect to the center axis of the discharge zone, as illustrated.

By this arrangement, the total exhaust conductance of the vacuum chamber 1 is approximately 4000 l/sec. Because of this, the diameter of the bottom of discharge area 4 is preferably made larger than that of the top, which results in a larger diameter of magnetic field coil 6 in this area than the diameter of the coil positioned at the top. The wafer is preferably designed to be, at the time of etching, positioned lower than the center of the coil axis in the direction of the thickness of the coil, i.e., vertically, in the FIG. 1 embodiment, at its lowest level, with an extremely large exhaust conductance below the discharging area. At this point, the resulting effective exhaust speed is thus 2000 l/sec. In a preferred embodiment, the volume of the vacuum chamber 1 is 100 l and the residence time for the etching gas molecules to stay in vacuum chamber 1 is preferably 50 msec.

Etching gas enters the discharge zone through the gas inlet 9 and buffer zone 15, which is preferably defined by a partition having a plurality of small meshlike holes and separated the discharge zone 4 from the buffer zone 15. The gas inlets 9 are provided at two or more locations, and arranged symmetrically with respect to the central axis of discharge zone 4, as shown.

Preferably, sample stage 7 is provided with a cooling mechanism 16 for cooling the wafer below 0° C. The sample stage 7 can be provided with an RF bias of 13.56 MHz to 400 kHz, from an RF source 17. Vacuum chamber 1 is preferably provided with a heater 18 to maintain its internal temperature above 50° C.

This high-speed exhaust dry etching machine was used to produce etched trenches in a monocrystalline silicon wafer. In this example, the wafer sample was a silicon substrate formed with a 500 nm-thick thermally-oxidized film, which was further covered with a photoresist mask to dry etch the oxidized film to form a hole pattern 0.1 $\mu$m to 1.0 $\mu$m in diameter. The photoresist mask was then removed to form a silicon dioxide ($SiO_2$) mask.

$Cl_2$ was used as the etching gas. The gas pressure was set to 0.5 mTorr, microwave power set to 500 W, the RF bias to 20 W at 2 MHz, and the wafer temperature to $-30°$ C. Gas flow of the etching gas was varied between 2 sccm and 100 sccm. The magnetic field intensity distribution provided b solenoid coil 6, which decreases from the top of the discharge zone as shown in FIG. 1 downwardly, was set so that the value of 875 Gauss was established at a location approximately 40 mm above the wafer. This location is known as the ECR (electron cyclotron resonance) point.

Figure 2:
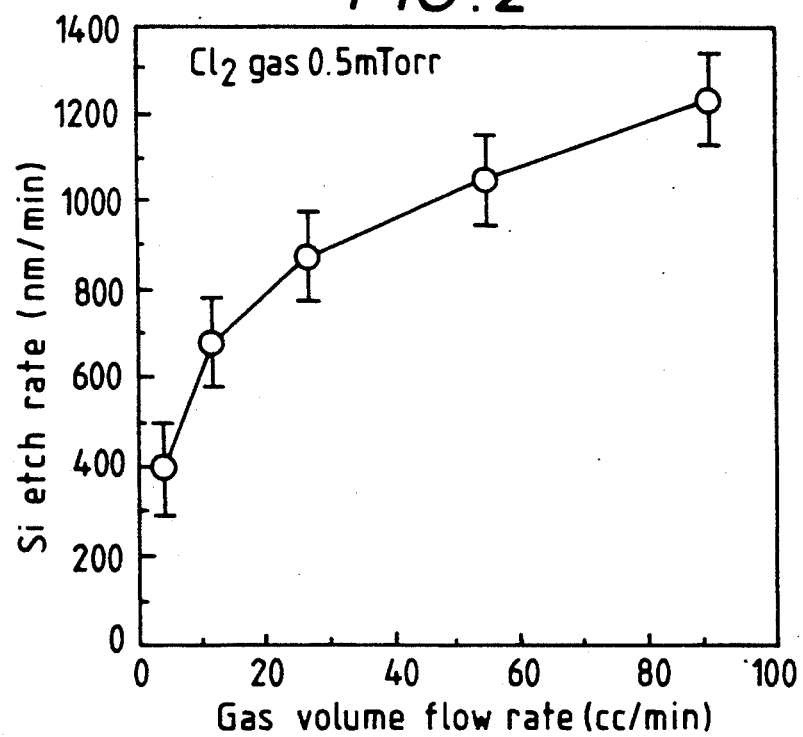
FIG. 2 shows a graph of the relationship between gas flow rate and etching speed using the high-vacuum, high-speed exhaust type microwave plasma etching machine of the present invention.
Figure 3:
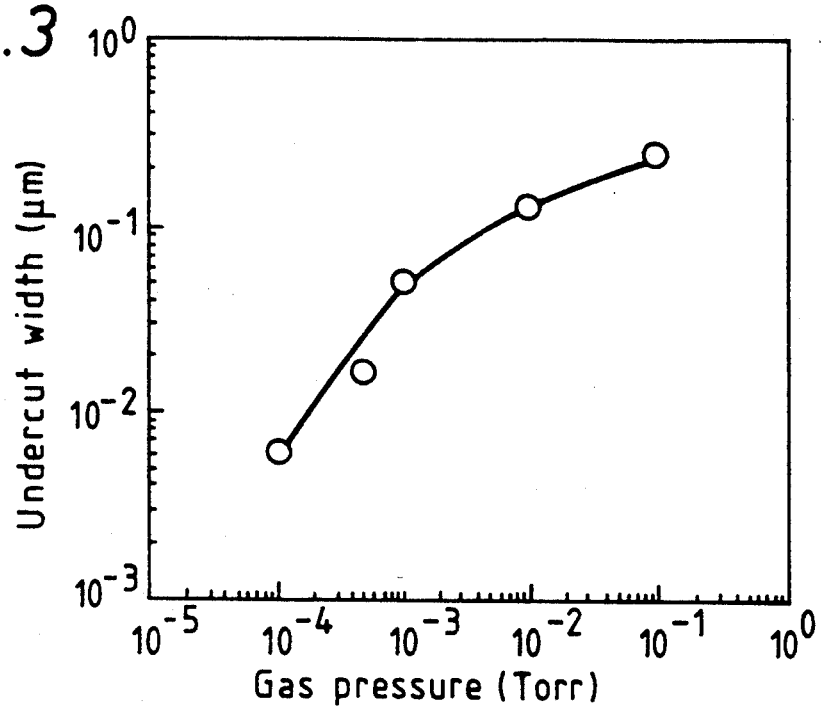
FIG. 3 is a graph showing the relationship between gas pressure and undercut width achieved using the high-vacuum, high-speed exhaust type microwave plasma etching machine of the present invention.

FIG. 2 illustrates the dependence of the silicon etch rate on the gas flow rate. As shown, the etch rate increased with the gas flow rate, from approximately 80 nm/min at 2 sccm to 1300 nm/min at 100 sccm. FIG. 3 shows the relationship between the gas pressure and the undercut width of the etched trench. The etched shape of the silicon substrate had high directivity because of the low gas pressure of 0.5 mTorr, and the undercut width of a hole etched 5 $\mu$m deep was less than 0.03 $\mu$m, exhibiting almost no gas flow rate dependence.

Figure 4:
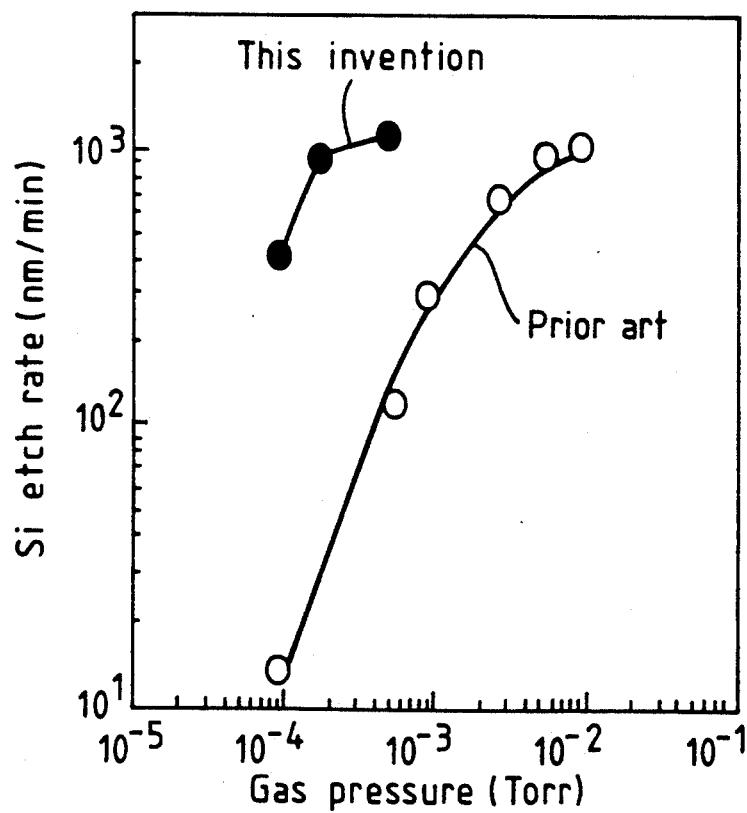
FIG. 4 is a graph showing the relationship between gas pressure and etch rate achieved using the high-vacuum, high-speed exhaust type microwave plasma etching machine of the present invention.

FIG. 4 illustrates the dependency of the etching speed on the gas pressure for a system, as described above, constructed to have an effective exhaust speed of 2500 l/sec, and for a conventional machine having an effective exhaust speed of 150 l/sec. The etching conditions are the same as for FIG. 2.

With the conventional etching system, the etch rate sharply decreases with gas pressure because the gas residence time is as long as 470 msec and the exhaust speed is slow, resulting in a reduced gas flow rate at low gas pressure. The present etching system, however, provides a high etch rate, greater than ten times that of the conventional system at a low gas pressure of less than 0.5 mTorr. For such a low gas pressure, the etch rate can be carried out at a high speed of greater than 1 $\mu$m/min.

At the same time, there is little dependency of the etching speed on the hole diameter, with the etching speed variation falling within 3% for hole diameters ranging from 0.1 $\mu$m to 1 $\mu$m. Furthermore, the $SiO_2$ etch rate shows little change even as the gas flow rate is changed. At a gas flow rate of 100 sccm, the selectivity ratio between the etched silicon and the etching mask of $SiO_2$ is approximately 50.

The etching of a phosphor-dubbed polysilicon sample produced similar results as those shown in FIGS. 2 and 3. For a flow rate of $Cl_2$ of 100 sccm, the etch rate was 1500 nm/min and the undercut width less than 0.03 $\mu$m.

In another etching example carried out using the system showed in FIG. 1, a contact hole was etched in a $SiO_2$ sample. The sample consisted of a silicon substrate with a 2 $\mu$m-thick oxidized film formed by chemical vapor deposition. A photoresist mask was formed on the oxidized film.

Using an etching gas of $CHF_3$, and pressure set to 0.5 mTorr, microwave power of 500 W was provided. Additionally, an RF bias was provided for the sample stage of 200 W at 800 kHz and a wafer temperature of 30° C.

The gas flow rate was varied between 2 and 100 sccm. The etch rate increased with the gas flow rate, from 50 nm/min at 2 sccm to 500 nm/min at 100 sccm. The etched shape of the hole formed in the $SiO_2$ layer had high directivity due to the low gas pressure, with an undercut width less than 0.05 $\mu$m for a 2 $\mu$m deep hole. Thus, little or no dependence on the gas flow rate was observed.

Furthermore, the dependence of the etching speed on the hole diameter is small, with the speed variation falling within 3% for hole diameters of 0.1 $\mu$m to 1.0 $\mu$m. The selectivity ratio between the $SiO_2$ and the photoresist more than doubled when the gas flow rate was increased from 2 sccm to 100 sccm.

Figure 8:
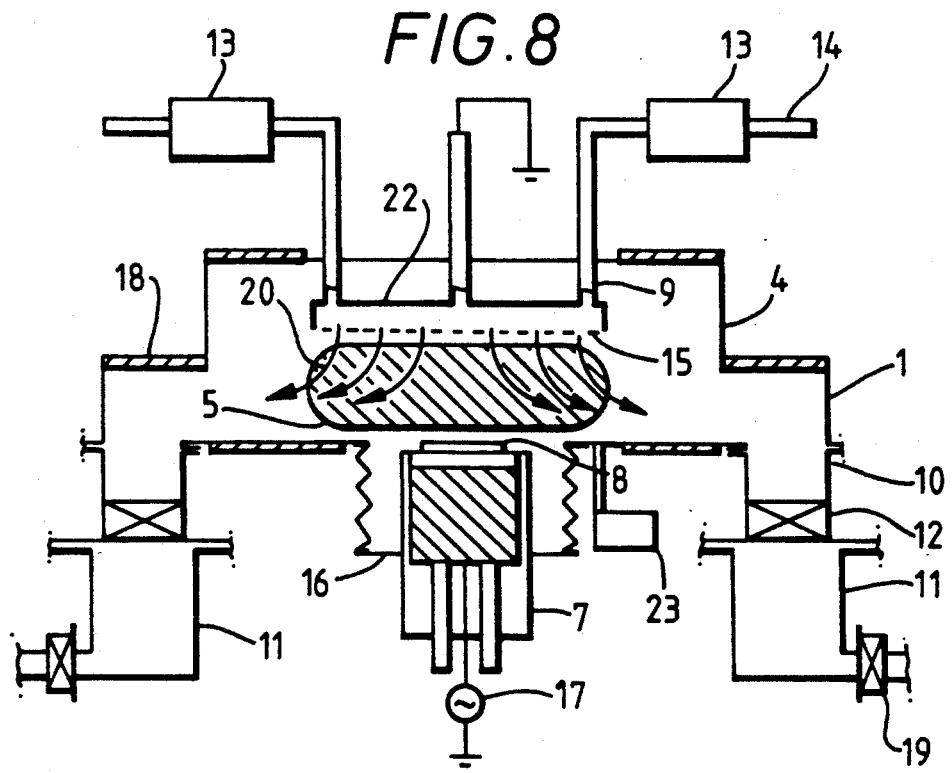
FIG. 8 is a simplified cross-section of a high-vacuum, high-speed exhaust type reactive ion etching machine constructed according to the teachings of the present invention.

Another embodiment of a plasma treatment machine constructed according to the teachings of the present invention is illustrated in FIG. 8. This etching machine is a high-speed exhaust reactive ion etching machine.

Etching gas is introduced into vacuum chamber 1 via gas pipes 14, gas flow rate controllers 13, buffer zone 15 and gas inlet 9, as before. A source of high-frequency radiation (13.56 MHz), for example, generates a gas plasma 5 in the discharge zone 4. Since this is a magnetron discharge RIE system having a magnetic field coil, discharge is possible even at 1 mTorr or less.

As before, a sample stage 7 on which a wafer 8 is provided is located in vacuum chamber 1. The etching gas plasma thus performs the etching on wafer 8, and is exhausted through exhaust buffer zone 10 and out of the vacuum chamber 1 by vacuum pump 11. Again, a variable conductance valve 12 is provided in the exhaust stage in order to vary the exhaust speed. Additionally, a butterfly valve 19 may be provided as shown.

As before, buffer zone 15 may be defined by a partition having a plurality of small meshlike holes, and the gas inlets 9 may be provided at two or more locations and arranged symmetrically with respect to the center axis of the discharge zone 4. Sample stage 7 is provided with a cooling mechanism 16 for cooling the semiconductor wafer below 0° C., and vacuum chamber 1 is provided with a heater 18 to maintain the vacuum chamber temperature above 50° C.

In a preferred embodiment, vacuum pump 11 includes twin turbomolecular pumps each having an evacuation speed of 2000 l/sec, arranged symmetrically with respect to the center axis of the discharge zone. Total exhaust conductance of the vacuum chamber 1 is 4000 l/sec, resulting in an effective exhaust speed of 2000 l/sec. Volume of the vacuum chamber 1 is again 100 l, and the residence time for the gas in the vacuum chamber is 50 msec, as before.

The high-speed exhaust reactive ion etching system shown in FIG. 8 was used for performing etching on a photoresist in a multilayer resist mask. The sample consisted of a silicon substrate having a photoresist applied to a thickness of 1.5 $\mu$m, and thereafter baked to form an intermediate layer of spin-on-glass (SOG) or titanium silica. This intermediate layer was then patterned with a photoresist, and dry-etched to form a mask, used for etching a sublayer photoresist.

Oxygen was used as the etching gas, at a pressure of 0.5 mTorr. RF power was supplied via source 17 to sample stage 7 at 500 W, and the wafer temperature maintained at $-100°$ C. The gas flow rate was varied between 2 sccm and 100 sccm.

The etch rate increased with the flow rate of the etching gas, from 100 nm/min at 2 sccm to 1000 nm/min at 100 sccm. The etched shape of the photoresist had high directivity due to the low gas pressure, and the undercut width for the resist at a depth of 1.5 μm was 0.05 μm or less, showing little gas flow rate dependence.

Furthermore, the dependence of the etching speed on the hole diameter was small, with the speed variation falling within 3% for holes having a diameter between 0.1 μm and 1 μm.

Figure 9:
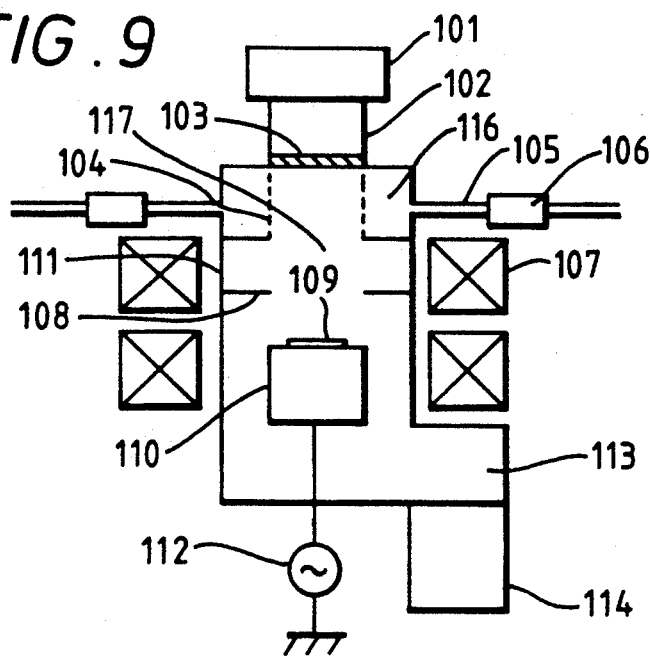
FIG. 9 is a simplified cross-section of a plasma treatment machine constructed according to the teachings of the present invention.

A further embodiment of the invention is shown in FIG. 9. This microwave plasma etching machine includes microwave source 101, which introduces microwaves through waveguide 102 and microwave inlet 103 into a discharge zone 117 in vacuum chamber 111. Etching gas is provided through gas piping 105 and gas flow rate controller 106 to the vacuum chamber 111, via gas inlet 104 and buffer zone 116. As before, buffer zone 116 is separated from the discharge zone by a partition having a plurality of meshlike holes.

The flow of the etching gas into discharge zone 117 is further controlled by a shield 108 so that the density of the etching gas is uniform in the central portion of discharge zone 117. The gas flow above wafer 109 is excited by the microwave radiation to form a gas plasma, which generates active particles that in turn etch wafer 109. A solenoid coil 107 provided about the discharge zone is adjusted to apply an external magnetic field to the plasma, thereby enabling the gas plasma to be formed.

Sample stage 110 can be provided with an RF bias from power supply 112. The RF power supply 112 applies a bias voltage to the wafer 109 to control the direction and energy of the incident ions, as is known. A cooling and heating mechanism may be provided to control the wafer temperature during etching, as is also known.

After entering the vacuum chamber 111 through gas inlet 104, the etching gas flow is transformed into plasma for etching wafer 109. After etching, the gas flow, together with reaction products, is carried beyond the sides of sample stage 110 to be exhausted through exhaust buffer zone 113 by a vacuum pump 114. Thus, the sample stage 110 acts to define a gas outlet for the discharge zone 117.

When a high-speed vacuum pump is used or when a plurality of vacuum pumps are used, the exhaust buffer zone 113 contributes to the uniformity of the evacuation speed of exhaust gas flowing past the sample stage. As a result, uniform etching may be carried out.

Figure 16:
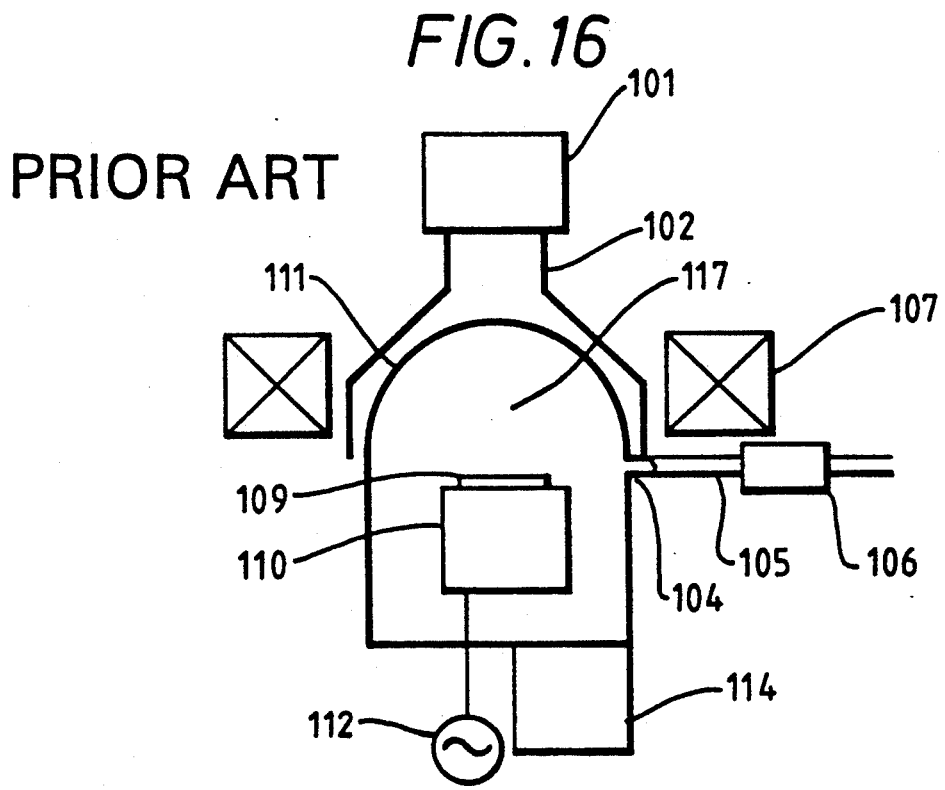
FIG. 16 is a simplified cross-sectional view of a conventional dry etching system.

In conventional systems, no particular means is provided at the gas inlet 104 to control the uniformity or density of the gas plasma. Gas piping 105 is instead directly connected to vacuum chamber 111, with no particular consideration being given to the locations of the connections. An example of such a machine is shown in FIG. 16.

According to the present invention, however, the effective area of the gas inlet opening is structured so that the gas flow speed does not exceed one-third the speed of sound in the chamber In the embodiment shown in FIG. 9, buffer zone 116 is defined in part by a partition having a plurality of small holes for allowing etching gas to pass into the discharge zone. This increases the effective opening area of the gas inlet to the discharge zone, thereby keeping the gas flow speed below the desired threshold.

The pressure of etching gas flowing through the gas flow rate controller 106 and the gas piping 105 is approximately one atmosphere, in a preferred embodiment. When the etching gas is supplied directly to the vacuum chamber 111, as in the prior art, the pressure difference between etching gas flow and the vacuum chamber is likely to cause a disturbance in the flow at the point of gas entry into the vacuum chamber. According to the present embodiment, buffer zone 116 suppresses such turbulence that would otherwise occur due to the pressure difference.

The present embodiment further includes a plurality of gas pipes 105, and associated gas flow rate controllers 106, preferably arranged symmetrically around the vacuum chamber 111 to further enhance the uniformity of gas flow.

Because the plasma is formed close to the central area of the discharge zone, the active particles strike the wafer more efficiently, further enhancing the etching uniformity. Since the flow of etching gas along the wall surface of discharge zone 117 would contribute little to the etching process, shield 108 is provided to force the gas flow to run closer to the central area of the discharge zone 117. The shielding 108, however, has a negative effect on the conductance of the flow, so that an overly large shield may produce adverse etching effects.

In the present embodiment, shield 108 is constructed to extend inwardly only so far as to vertically overlap the periphery of sample stage 110. In other words, looking downward from the top portion of the vacuum chamber, one would see substantially no gap between the radially inward edge of shield 108 and the radially outward edge of sample stage 110. However, shield 108 preferably does not extend inwardly so far as to overlap a wafer on sample stage 110.

For uniform flow, the exhaust system is preferably arranged so that symmetrical exhaust flow from the periphery of sample stage 110 occurs. However, in the embodiment wherein sample stage 110 is connected with an RF power supply 112, or provided with a cooling mechanism for controlling wafer temperature for low-temperature dry etching, such symmetry in the exhaust system is difficult to construct.

Therefore, the exhaust buffer zone 113 provided in the embodiment shown in FIG. 9 serves to distribute the exhaust capacity of vacuum pump 114 uniformly over the exhaust portion of discharge zone 117. When a plurality of vacuum pumps are employed to increase the exhaust capacity, exhaust buffer zone 113 contributes to the uniformity of exhaust gas flow from discharge zone 117.

Figure 10:
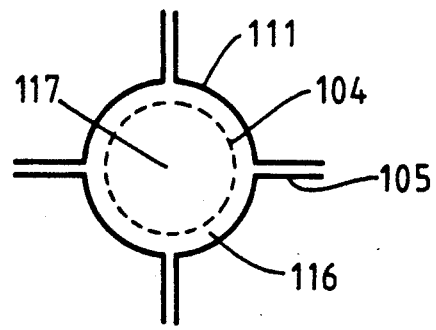
FIG. 10 is a partial plan view of a plasma treatment machine constructed according to the teachings of the present invention.

FIG. 10 illustrates a particular embodiment of the gas inlet/buffer zone arrangement of the embodiment shown in FIG. 9. In the horizontal cross-section shown in FIG. 10, vacuum chamber 111 is shown to be provided with four gas pipes 105, although as few as one gas pipe may be used because of the presence of the buffer zone 116. However, in a preferred embodiment, flow uniformity is improved with at least two pipes symmetrically installed with respect to the vacuum chamber 111.

Using the dry etching system shown in FIG. 9, a silicon substrate surface was etched to form holes and trenches between 0.3 and 0.5 μm in size. The sample was patterned with a resist mask, or alternatively with a SiO$_2$ mask. SF$_6$ gas was used as an etching gas, and the microwave power set to 400 W. Gas pressure was set to 0.5 mTorr, gas flow rate to 50 sccm, and the RF bias to 30 W at 13.56 MHz.

An etching speed greater than 500 nm/min was obtained by this construction. Side etch width was less than 0.05 μm, providing a good vertical shape to the etch.

Figure 11:
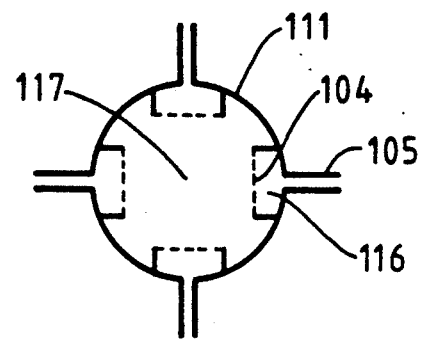
FIG. 11 is a partial plan view of a plasma treatment machine constructed according to the teachings of the present invention.

A further embodiment of the gas inlet/buffer zone construction is illustratively shown in FIG. 11. This embodiment employs a plurality of independent buffer zones 116, illustratively corresponding in number to the gas pipes 105. A comparison to the embodiment shown in FIG. 10 shows better uniformity of gas flow in the FIG. 10 embodiment, but the embodiment of FIG. 11 has the advantage of being able to be manufactured more easily.

In either embodiment, the shielding 108 can be formed as a single shield, or as a plurality of multiple shields, and is not restricted to being circular as described above. Moreover, a plurality of circular shields 108 may be provided in vacuum chamber 111 at different vertical spacings from the sample stage, or a combination of circular shields or individual noncircular shields may be arranged. Further, shielding of different sizes and shapes may be arranged at various locations in the vacuum chamber 111 to control gas flow.

The provision of buffer zone 116 as described improves etching speed uniformity for an 8-inch semiconductor wafer by more than two times that of a system that does not employ a buffer zone, thus limiting etch rate variations to within ±10%.

Figure 12:
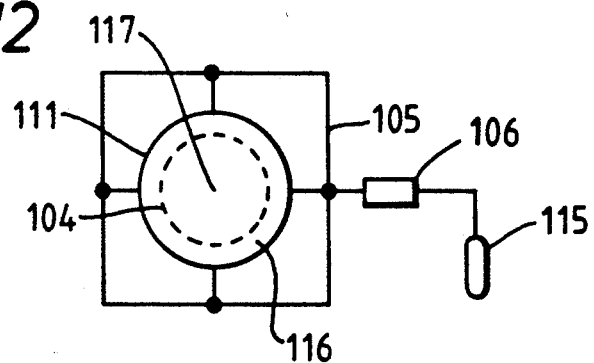
FIG. 12 is a partial plan view showing a gas piping arrangement of a plasma treatment system constructed according to the teachings of the present invention.

FIG. 12 illustrates a further embodiment of the gas pipe arrangement. In this example, the gas pipes 105 are commonly connected externally to the vacuum chamber 111 at multiple locations, so that gas flow from gas cylinder 115 is controlled by a single gas flow rate controller 106. Since a single gas flow rate controller is employed, this embodiment enjoys the advantage of being able to control gas flow accurately, and has a simple and less expensive equipment construction.

However, uniformity of gas flow in the discharge zone 117 will deteriorate to a certain extent due to the different effective lengths of gas pipes 105 from the gas flow rate controller 106 to the various connection points at vacuum chamber 111. This reduction in uniformity poses no serious problem because the uniformity can be adjusted by making other changes in the system, such as changing the sizes or locations of buffer zones 116 (in a plural buffer zone arrangement), or changing the opening areas and opening degrees of the holes in the partition between the buffer zone and the discharge zone. Moreover, the mounting height of the buffer zone can be varied according to connection locations, and the shielding 108 can be adjusted as described earlier in order to tailor the gas flow.

The use of the arrangement shown in FIG. 12 has improved the etching speed uniformity for an 8-inch semiconductor wafer by a factor of greater than two in comparison with equipment having only a single gas pipe, thus limiting etch rate variations to within ±10%.

Figure 13:
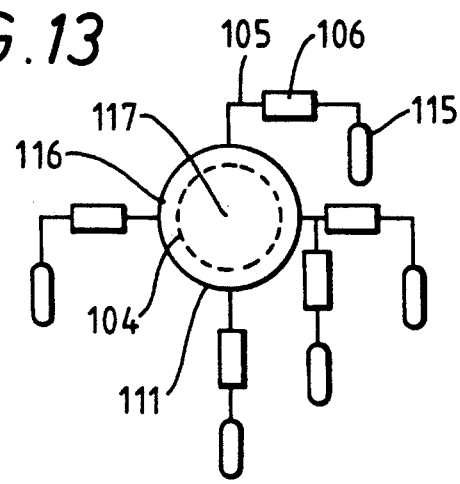
FIG. 13 is a partial plan view showing a gas piping arrangement of a plasma treatment system constructed according to the teachings of the present invention.

FIG. 13 shows a further arrangement of gas piping, in which a plurality of gas cylinders 115 and gas flow rate controllers 106 are provided for supplying etching gas to the vacuum chamber 111. As shown, more than one gas cylinder and gas flow rate controller may be provided per gas inlet 104.

This arrangement enables uniform gas flow in the vacuum chamber 111, and further enables the use of different kinds of etching gas to be mixed in the vacuum chamber 111. By adjusting the number and positions of gas circuits for each kind of gas, and by regulating the gas flow in the individual pipes, different kinds of gases may be thoroughly mixed in a uniform manner.

This embodiment has improved the etching speed uniformity for an 8-inch semiconductor wafer by a factor of greater than two when compared with equipment using a single gas cylinder, thus limiting the etch rate variations to within ±10%.

Figure 14:
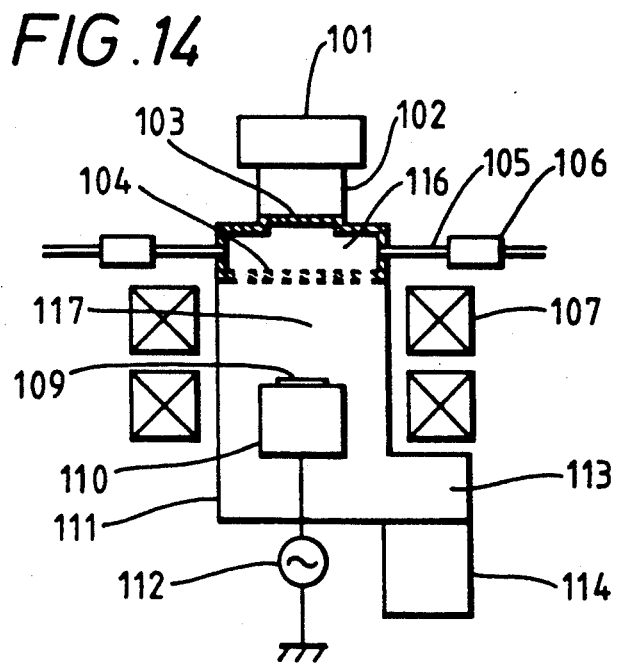
FIG. 14 is a simplified cross-section of a plasma treatment system constructed according to the teachings of the present invention.

Another embodiment of the present invention is shown in FIG. 14. This embodiment includes a buffer zone 116 provided similarly to that shown in FIG. 9, except that the buffer zone 116 is provided vertically above the sample stage 110 and wafer 109, so that etching gas is directed vertically downward substantially perpendicular to the plane of the wafer table on which the wafer is supported. Gas flow uniformity is thereby improved, particularly with regard to the increase of gas flow density at the center of discharge zone 117.

However, in this construction, high gas pressure may occur in the propagation path of the microwave radiation, which may hinder the propagation of the radiation or cause discharges in buffer zone 116. In practice, however, this does not pose a serious problem since adjustments may be made by adjusting the emitted microwave power or solenoid coil 107, or by time-modulating the gas flow and microwave emission to suppress the pressure increase in buffer zone 116.

Figure 19A:
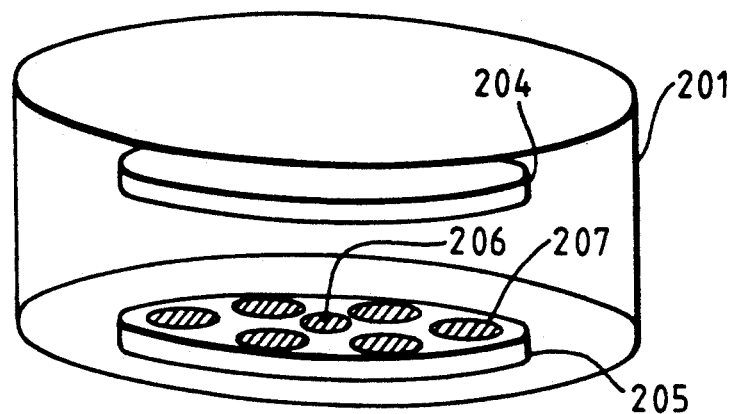
FIGS. 19a and 19b are simplified views of a large-vessel, high-speed exhaust reactive ion etching system constructed according to the teachings of the present invention.
Figure 19B:
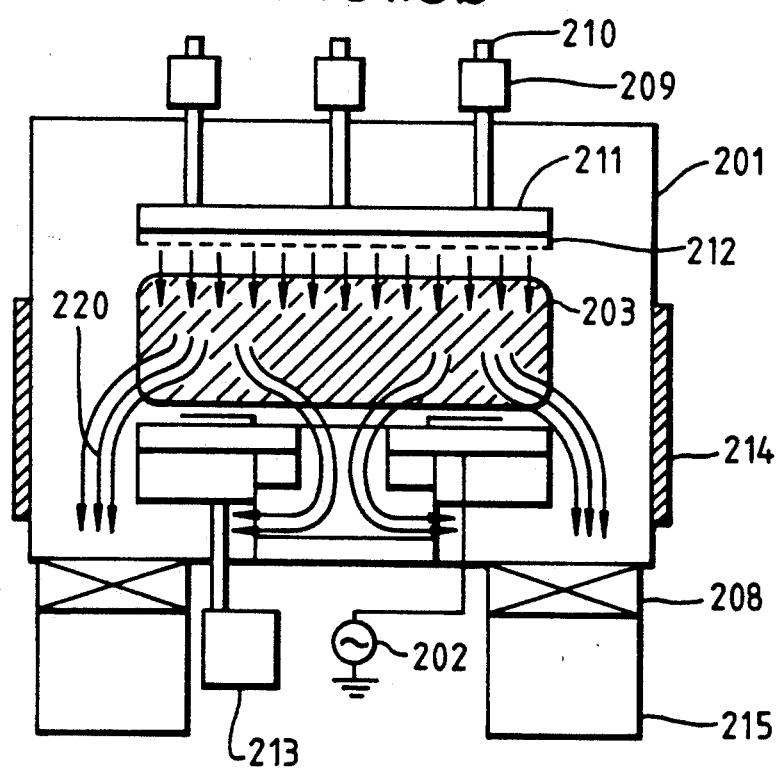

A large-vessel RIE system embodiment is illustrated in FIGS. 19a and 19b, wherein a large-vessel high-speed exhaust system includes vessel 201, RF power supply 202 for generating gas plasma 203, parallel-plate cathode coupling electrodes 204 (upper) and 205 (lower) for applying high frequency to the gas, gas outlet 206 at the center of lower electrode 205 on which wafers 207 are supported, conductance valve 208, gas controllers 209, gas pipes 210, gas inlets 211 and buffer zone 212 are provided. Cooling mechanism 213 cools the wafers 207 below 0° C., and heater 214 heats the vessel 201 to a temperature greater than 50° C., as before.

Vessel 201 is preferably cylindrical in shape, about 120 cm in diameter and about 40 cm high. Upper electrode 204 is preferably maintained at ground potential, and lower electrode 205 used to apply the high frequency. The lower electrode is preferably 90 cm in diameter, and gas outlet 206 10 cm in diameter to enable exhaust of the etching gas both from the center of and around the lower electrode to improve etching uniformity.

The electrode area is preferably about 6300 $cm^2$ to provide support for six 8 inch wafers 207 for simultaneous etching.

As before, the evacuation speed of the etching gas can be varied by adjusting conductance valve 208. Buffer zone 212 again is provided with a plurality of meshlike small holes, and two or more gas inlets 211 may be arranged symmetrically with respect to the center axis of the discharge zone.

Vacuum pump 215 preferably includes two turbomolecular pumps having a pumping speed of 6000 l/sec, and arranged symmetrically with respect to the center axis of the discharge zone. The exhaust conductance of the vessel is 12,000 l/sec, resulting in an effective exhaust speed of 6000 l/sec. Vessel 201 has a volume of approximately 500 l, and the residence time of the etching gas is 83 msec, in this preferred embodiment.

In a representative example, a silicon monocrystalline substrate was etched using the system shown in FIGS.

19a and 19b. The sample was an 8-inch silicon substrate formed with a photoresist mask on its surface. In the example, six such wafers were mounted on the sample stage.

CF$_4$ was used as an etching gas, set at a pressure of 200 mTorr. RF power was provided at 2 kW (power density 0.32 W/cm$^2$), and the wafer temperature established at $-50°$ C.

By varying the opening of the conductance valve, the exhaust speed and thus the gas residence time were varied. The gas flow rate was varied while the gas pressure was kept constant.

Figure 20:
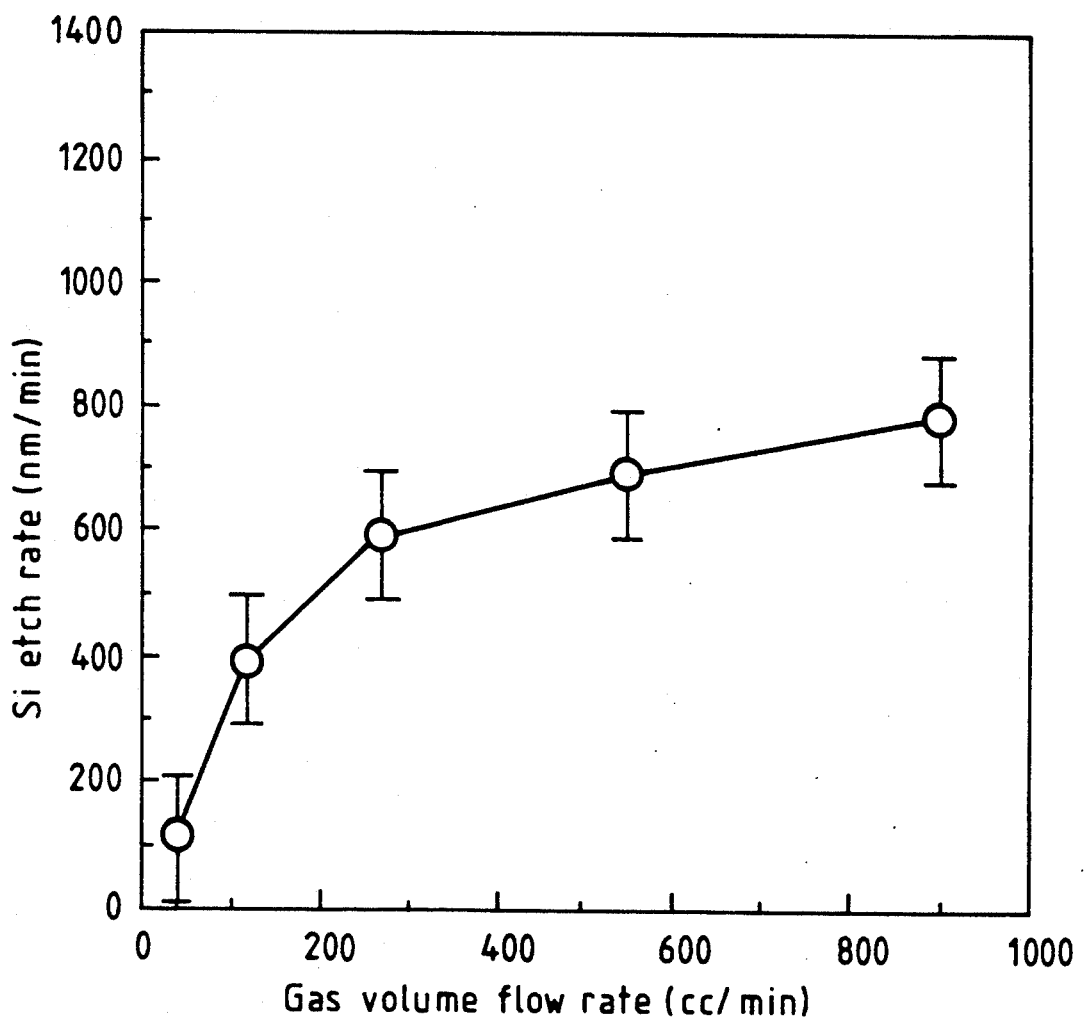
FIG. 20 is a graph of the relationship between gas flow rate and etching speed achieved using a large-vessel, high-speed exhaust reactive ion etching machine.

FIG. 20 illustrates the dependence of the silicon etch rate on the gas flow rate under these conditions. The etch rate of 100 nm/min at the gas flow rate of 50 sccm increased to 800 nm/min with an increase in gas flow rate to 900 sccm. The undercut width was 0.1 $\mu$m when the substrate was etched to a depth of 1 $\mu$m. The selectivity ratio between silicon and photoresist was 4.0, and the etching speed discrepancy (a measure of uniformity) within each wafer and among the various wafers was within $\pm 5\%$.

Although the foregoing embodiment is directed to a reactive ion etching system, the lower electrode 205 having a single central aperture for exhausting etching gas may also be utilized in a microwave plasma discharge system.

Figure 21A:
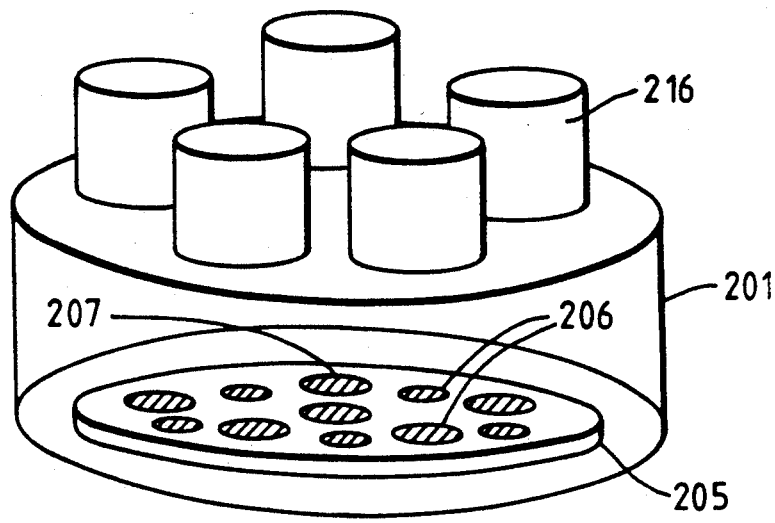
FIGS. 21a and 21b are simplified views of a large-vessel, high-speed exhaust microwave plasma etching machine constructed according to the teachings of the present invention.
Figure 21B:
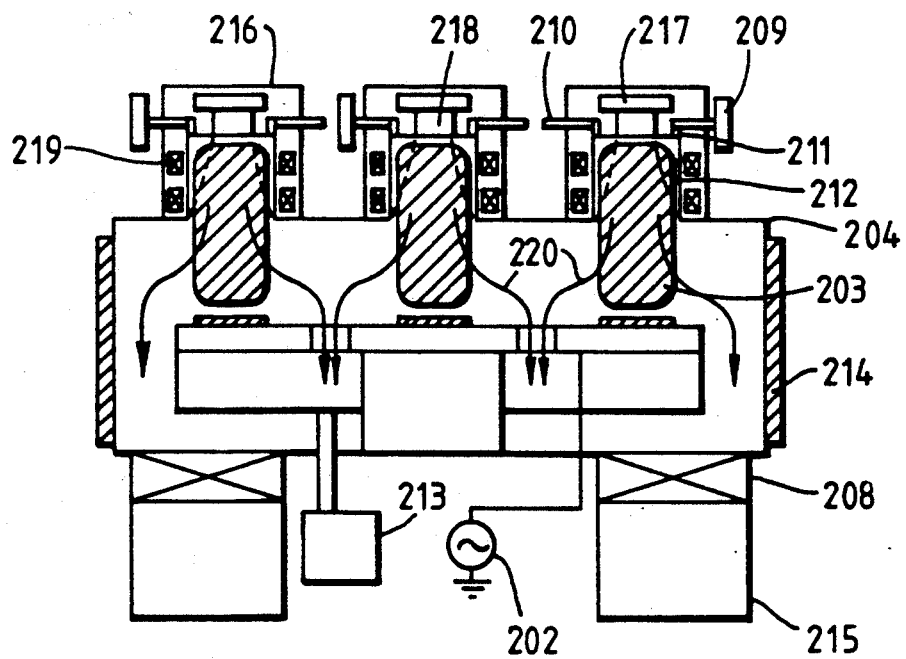

An embodiment of another large-vessel high-speed evacuation plasma treatment machine according to the invention as shown in FIGS. 21a and 21b. Vessel 201 has five discharge zones 216, each of which can independently generate gas plasma 203. Five 8-inch wafers 207 are shown on sample stage 205 in the vessel 201 below the corresponding five discharge zones, and are subjected to simultaneous etching.

In the sample stage, a plurality of gas outlets 206 are formed in the vicinity of the five wafer mounting portions. The etching gas is introduced into vessel 201 along with microwave radiation of 2.45 GHz, generated by microwave sources 217 through waveguides 218 into discharge zones 216, where the gas is transformed into a gas plasma under the further influence of solenoid coils 219, which provide a magnetic field of 875 Gauss by ECR.

The etching gas is introduced from gas inlets 211 into the discharge zones 216, and then exhausted out of vessel 201 by vacuum pumps 215. The exhaust speed can be changed by varying conductance valves 208.

The etching gas passes through gas flow rate controllers 209 and gas pipes 210 before being introduced through gas inlets 211 into discharge zones 216 through buffer zones 212, which may be constructed according to any of the embodiments described previously. Preferably, two or more gas inlets 211 are arranged symmetrically with respect to the center axis of each discharge zone.

The sample stage on which the wafers are mounted is provided with a cooling mechanism 213 for cooling the wafers below 0° C. in the illustrated embodiment. RF bias source 202 provides an RF bias of 13.56 MHz to 400 kHz, and vessel 201 preferably has a heater 214 for heating it to 50° C. or higher.

In the illustrated embodiment, vacuum pump 215 includes two turbomolecular pumps with a pumping speed of 20,000 l/sec arranged symmetrically about the center of vessel 201. The exhaust conductance of the vessel 201 is set to 40,000 l/sec so that the effective exhaust speed is 20,000 l/sec. The total volume of vessel 201 and discharge zones 216 is approximately 2000 l, and the residence time of etching gas in the vessel 201 is 100 msec, in the illustrated embodiment.

With such a large-vessel, high-speed exhaust dry etching machine, five 8-inch silicon substrates formed with photoresist masks were etched. CF$_4$ was used as the etching gas, set at a pressure of 5 mTorr. The microwave source was set to provide microwave power of 2 kW, the RF bias was set to 200 W at 2 MHz, and wafer temperature was maintained at $-50°$ C.

The silicon etch rate under these conditions was 1.5 $\mu$m/min at a gas flow rate of 900 sccm. The undercut width from the silicon mask was less than 0.1 $\mu$m for a 1 $\mu$m-deep trench. The selectivity ratio between silicon and the photoresist was 3.0, and the etch rate discrepancy (a measure of uniformity) within each wafer and among the several wafers was less than $\pm 5\%$.

Figure 22:
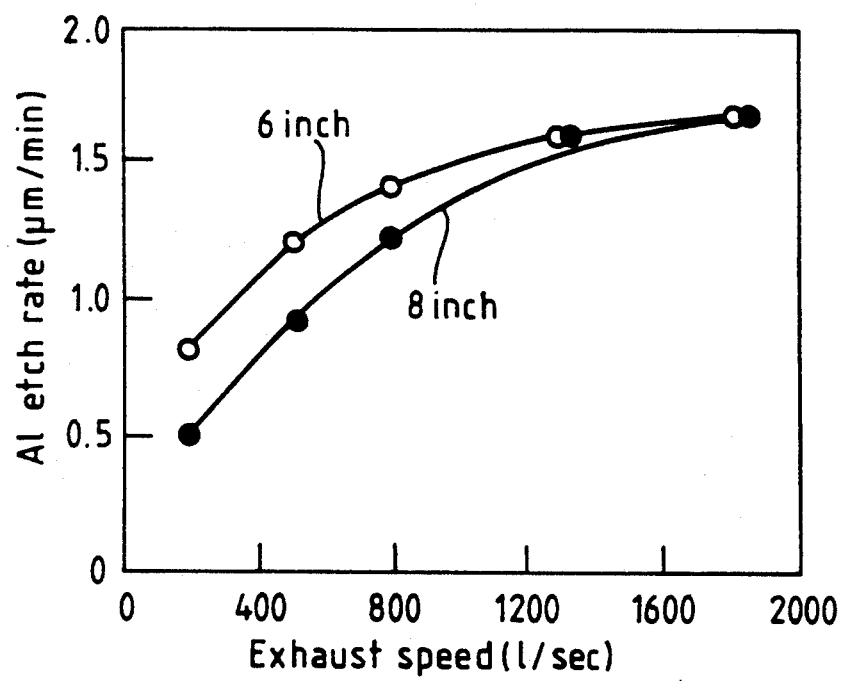
FIG. 22 is a graph of Al etch speed and effective exhaust speed of a particular embodiment of the invention.

In a specific embodiment using the high speed exhaust microwave plasma etching device shown in FIG. 1, several patterns which varied in total area were formed on an 8-inch wafer, and Al etching was performed. Etching conditions included: Cl$_2$ gas pressure=3 mTorr, microwave power=5 W, RF bias=50 W at 2 MHz, and wafer temperature=0° C. FIG. 22 shows the relationship between the effective exhaust speed (hereafter often referred to simply as exhaust speed in the explanation of embodiments) and the etch speed, when the wafer diameter is changed from 6 inches to 8 inches. The selectivity ratio of the etching area in the wafer was 50%. Since the gas pressure was constant (3 mTorr), the gas flow rate (Q sccm) to exhaust speed (S l/sec) was: Q=79.05$\times$S$\times$0.003.

Previously, for Al etching at a low exhaust speed (approximately 200 l/sec), for a 6-inch wafer, the etch speed was approximately 0.8 $\mu$m/min. When the exhaust speed was 500 l/sec, the etch speed became 1.2 $\mu$m/min, about 1.5 times faster; when 800 l/sec, 1.4 $\mu$m/min, about 1.8 times faster; and when 1300 l/sec, 1.6 $\mu$m/min, double. For an 8-inch wafer more changes were recognized: at 800 l/sec, 2.4 times faster than usual; and at 1300 l/sec, about triple the usual speed.

Accordingly, it was discovered that if the target is to obtain, for an 8-inch wafer, an etch speed 1.5 times or more that of the conventional etch speed (6-inch, 200 l/sec), an exhaust speed of at least 800 l/sec or more is needed; and that if the target is to obtain more than double this conventional exhaust speed, at least 1300 l/sec or more is needed.

Incidentally, this etch speed dependency on area has been found to be somewhat similar in materials other than Al, such as Si, etc. In order to obtain 1.5 times or more the conventional etch speed for an 8-inch wafer, 800 l/sec or more exhaust speed was needed. Also, when etching conditions varied, such as gas pressure, microwave power, sample temperatures, bias, etc., 800 l/sec or more exhaust speed was needed to obtain 1.5 times or more the conventional etch speed for an 8-inch wafer.

Figure 23:
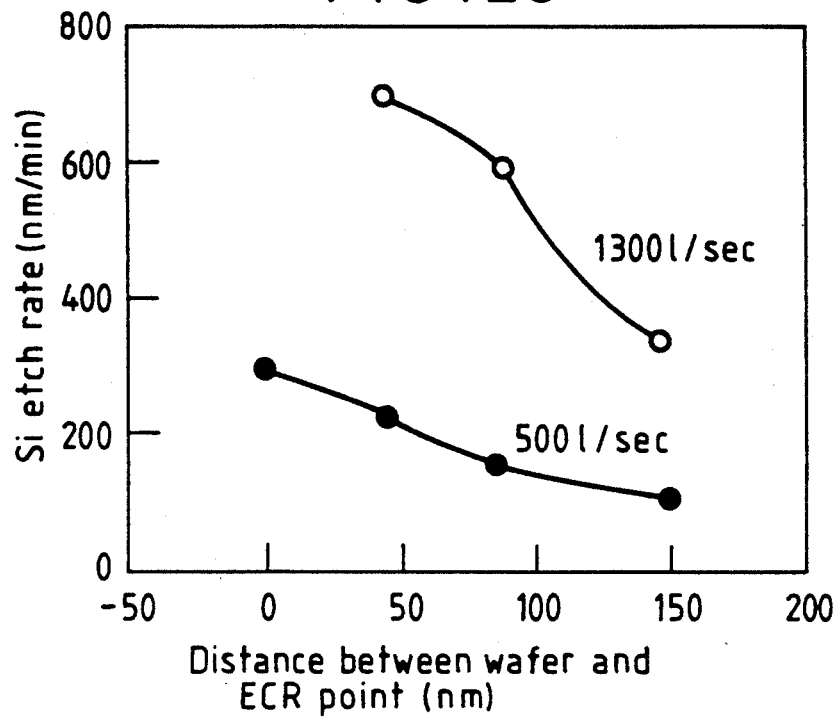
FIG. 23, is a graph of Si etch speed and wafer ECR surface distance of a particular embodiment of the invention.

In another embodiment using the high speed exhaust microwave plasma etching device shown in FIG. 1, the distance (the ECR surface distance) between the ECR surface (a surface with a magnetic field becoming 875 G in plasma) and the wafer was changed, and Si etching was performed. Etching conditions were: Cl$_2$ gas pressure=0.5 mTorr, microwave power=500 W, RF bias=20 W at 2 MHz, and wafer temperature=$-30°$ C. FIG. 23 shows the relationship between the ECR surface distance and etch speed when the exhaust speed is changed. At a conventional exhaust speed (200 l/sec), when the ECR surface distance was expanded from 0 to 150 mm, the etch speed decreased from 300 to 100 nm/min. On the other hand, for etching with a high speed exhaust of 500 l/sec, even with an ECR surface distance as great as 150 mm, a 300 nm/min etch speed was obtained. Furthermore, when the distance was shortened, the etch speed increased to 1000 nm/min or more. That is, even when the ECR surface distances are to some extent long due to the high-speed exhaust etching, it was possible to obtain an etch speed equal to or greater than those obtained with shorter ECR surface distances.

Figure 24:
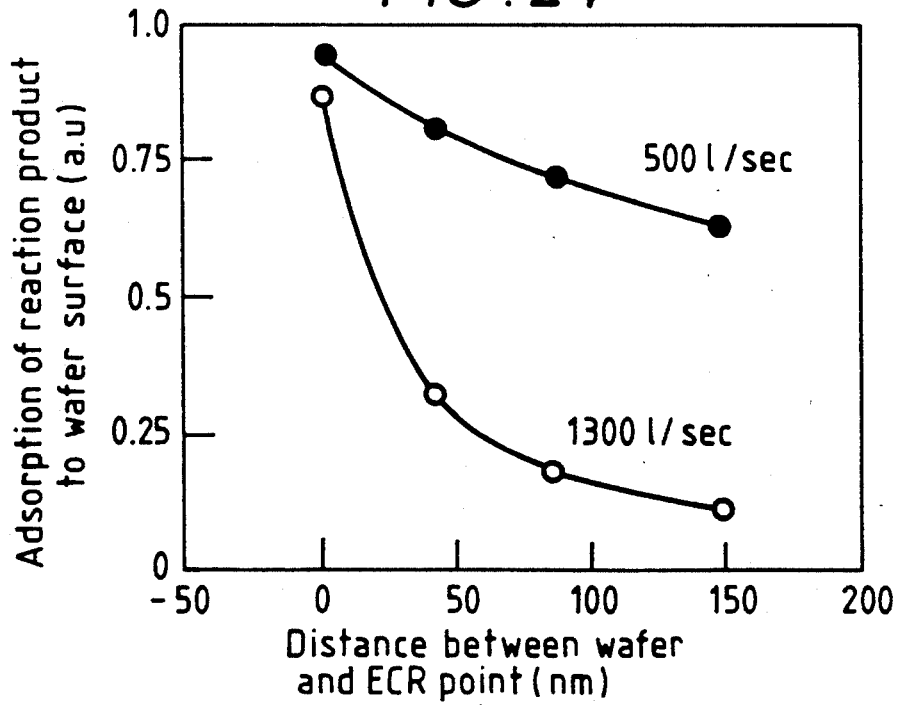
FIG. 24 is a graph of reaction products on a wafer surface and wafer ECR surface distance of a particular embodiment of the invention.

A problem associated with closely-positioned ECR surfaces is that the reaction products from the wafer are re-dissociated, allowing re-deposition on the wafer surface, because the dissociation efficiency of plasma is high in the ECR area. This may lead to deterioration of the etching's form, and contamination of the surface. Also, when the ECR distance is reduced, the uniformity of the etching may be decreased. When the amount of reaction products adsorbed into the wafer was examined by surface analysis, it was found as shown in FIG. 24, that when the exhaust speed is 500 l/sec, the adsorption amount increases as the ECR surface distance is shortened. When the exhaust speed is low (200 l/sec), the exhaust speed of reaction products is slow, so that even if the ECR surface distance is to some extent long and the re-dissociation is less, the amount adsorbed into the wafer increases. Therefore, for high speed etching with low contamination from lesser adsorption of reaction products, it is better to have the ECR surface distance be lengthened somewhat to exhaust at high speed. From the results in FIG. 24, it was found that it is appropriate to have an ECR surface distance of 40 mm or more and to use an exhaust speed of 500 l/sec.

Figure 25:
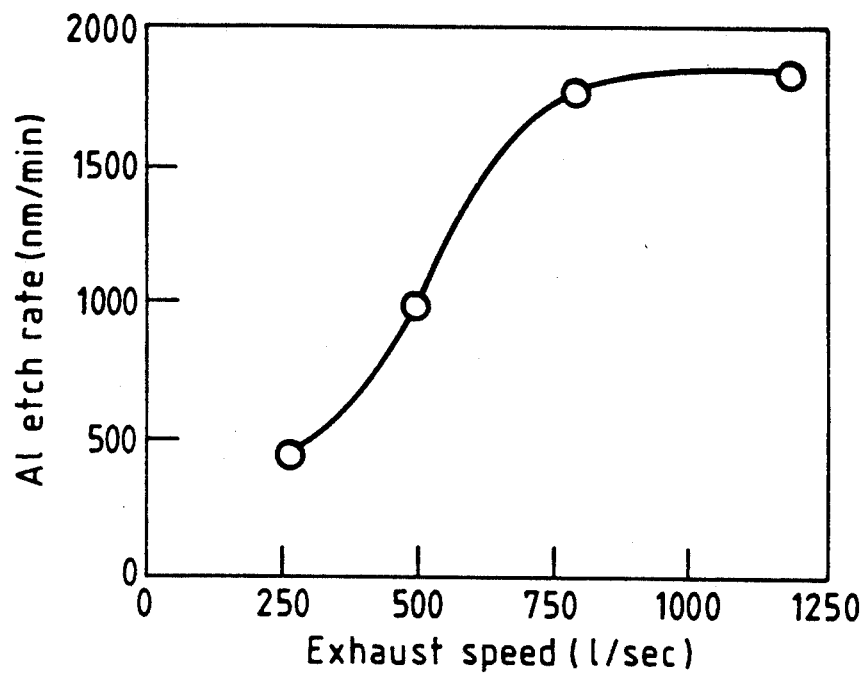
FIG. 25 is a graph of Al etch speed and effective exhaust speed of a particular embodiment of the invention.

In a further embodiment using the high speed exhaust microwave plasma etching device shown in FIG. 1, Al etching was performed at 1 to 10 mTorr gas pressure. Etching conditions were: $Cl_2$ gas pressure=5 mTorr, microwave power=500 W, RF bias=20 W at 2 MHz, and wafer temperature=0° C. FIG. 25 shows the relationship between exhaust speed and Al etch speed. The gas flow rate is the gas pressure multiplied by the exhaust speed. At 500 l/sec or more, the etch speed greatly increased.

Figure 26:
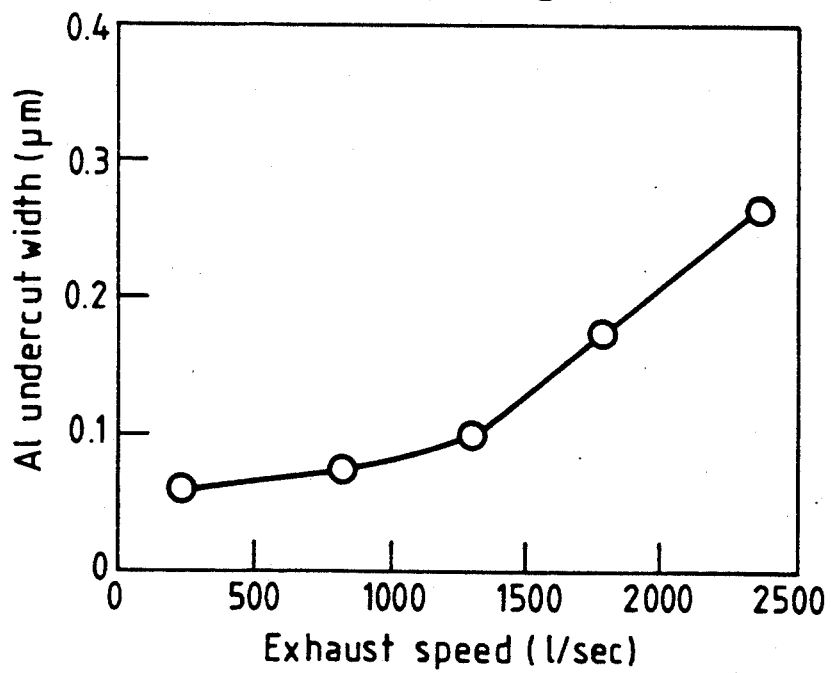
FIG. 26 is a graph of Al undercut amount and effective exhaust speed of a particular embodiment of the invention.

On the other hand, FIG. 26 shows the undercut amount's dependency on exhaust speed. Since the gas pressure was 5 mTorr, which is high, undercuts occurred easily, and especially tended to increase at an exhaust speed of 1300 l/sec. The reason for the smaller undercut amounts at 1300 l/sec or less exhaust speed was that the reaction products' residence time was long, and the reaction products were deposited on the pattern's lateral, which prevented lateral etching. Therefore, during etching, when undercuts could not be controlled without using lateral deposits, and a high etch speed was required, 500 l/sec was appropriate for controlling undercut amounts of 0.1 μm or less at a high etch speed of 1000 nm/min or more. Similar etching tendencies were also obtained at 1 to 10 mTorr pressure, and the exhaust speeds which satisfied the 0.1 μm or less undercut amount at the high etch speed of 1000 nm/min or more were between 500 l/sec and 1300 l/sec. Incidentally, the gas residence time was 300 msec at 500 l/sec.

Figure 27:
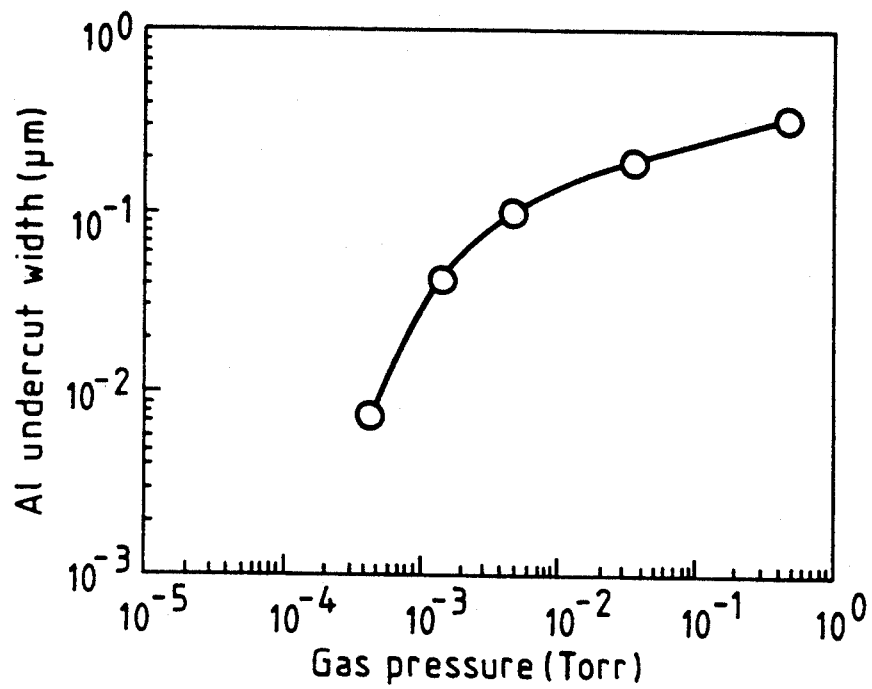
FIG. 27 is a graph of Al undercut amount and gas pressure of a particular embodiment of the invention.

In a further embodiment using the high speed exhaust microwave plasma etching device shown in FIG. 1 with a source of $BCl_3$ gas, Al etching was performed. Etching conditions were: $BCl_3$ gas pressure=4 mTorr, microwave power=500 W, RF bias=20 W at 2 MHz, and wafer temperature=20° C. FIG. 27 shows the Al undercut amount's dependency on gas pressure. The exhaust speed was 800 l/sec. The undercut amount greatly decreased at 5 mTorr or less, becoming 0.1 μm or less. Compared to etching using $Cl_2$, $BCl_3$ decreased the amount of undercuts at higher gas pressures. The reason for this is that $BCl_3$ was deposited on the pattern lateral and was effective in protecting the lateral.

Figure 28:
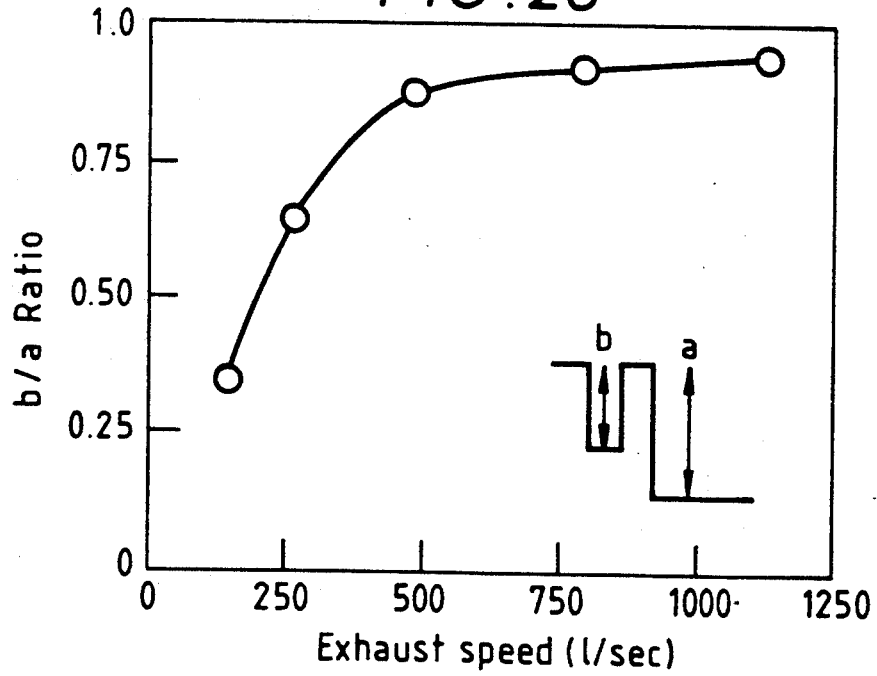
FIG. 28 is a graph of Al etching depth ratio (pattern size dependency) and effective exhaust speed of a particular embodiment of the invention.

FIG. 28 shows the exhaust speed dependency of the Al etch speed's microloading (pattern size dependency: here referring to the etch speed ratio of 0.2 μm (a) and 10 μm (b) for recessed patterns, a/b). Microloading decreased as exhaust speed increased, becoming 0.9 or more at 800 l/sec or more, which could be used for practical applications. The microloading decreases as the exhaust speed increases because etching reactive particles can be sufficiently supplied even in small recesses due to the increase in exhaust speed. Therefore, in order to perform Al etching using $BCl_3$ while controlling undercuts and microloading, it was discovered that it is better for the gas pressure to be 5 mTorr or less and for the exhaust speed to be 800 l/sec or more.

Microloading relates to over-etching amounts required for finishing the etching of small recesses. In this case, microloading of 0.9 or more does not present any big problem for practical use, so that there is no need to increase the exhaust speed unnecessarily.

Figure 29:
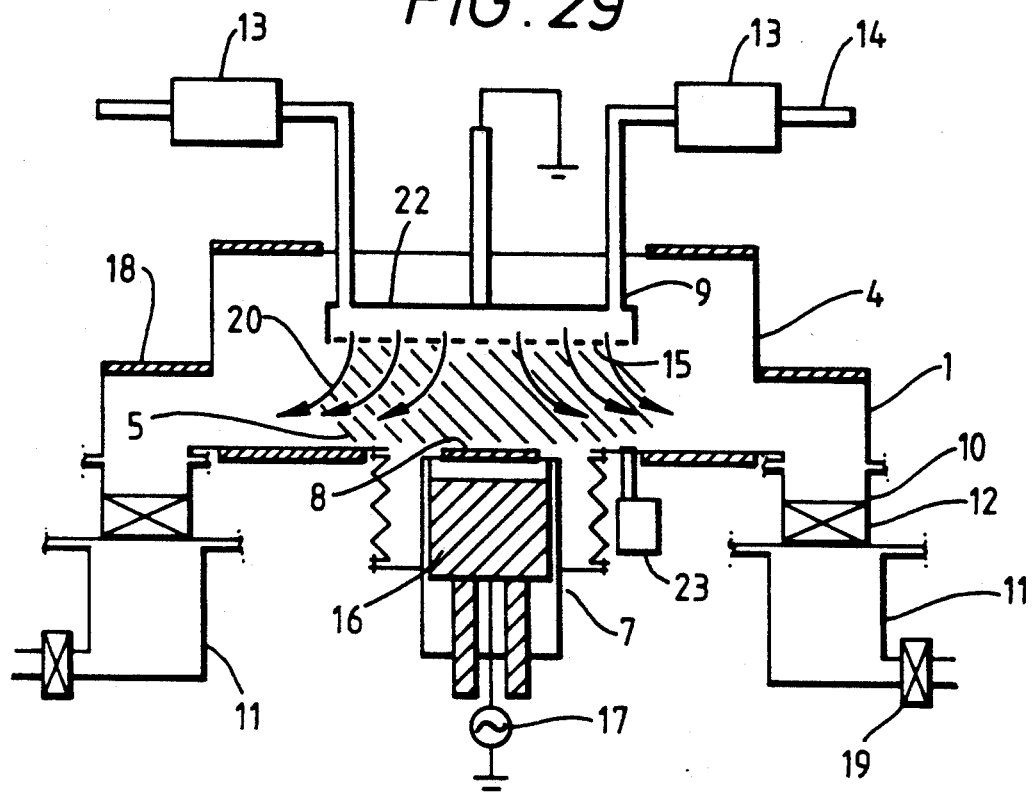
FIG. 29 shows a high exhaust speed reactive ion etching (RIE) device constructed according to the teachings of the invention.

In another embodiment using the high speed exhaust microwave plasma etching device shown in FIG. 1 and the reactive ion etching device shown in FIG. 29, Al etching was performed. Etching conditions for the microwave etching device were: $Cl_2$ gas, microwave power=500 W, RF bias=20 W at 2 MHz, and wafer temperature=10° C.

Figure 30:
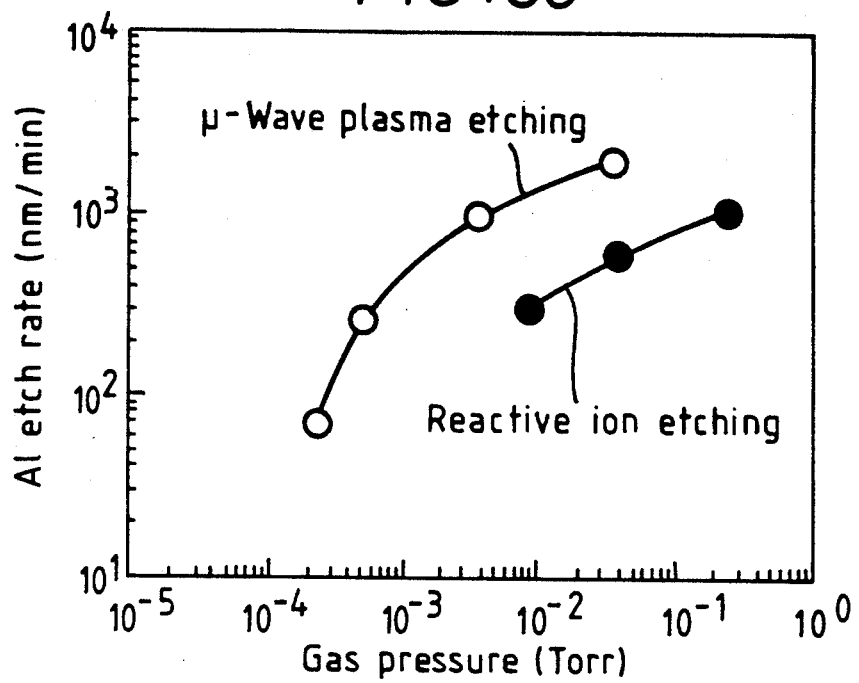
FIG. 30 is a graph of Al etch speed and gas pressure of a particular embodiment of the invention.

FIG. 30 shows the relationship between Al etch speed and gas pressure. The exhaust speed was set at 500 l/sec. Microwave etching allows etching at low gas pressures, so that undercuts fell 0.1 μm or less at 4 mTorr, and the etch speed was 1000 nm/min. Reactive ion etching does not allow etching at low gas pressures, so that undercuts were 0.2 μm at 10 mTorr, and the etch speed was 300 nm/min. That is, compared to reactive ion etching, microwave etching enables high speed etching with fewer undercuts at low gas pressures.

Figure 31:
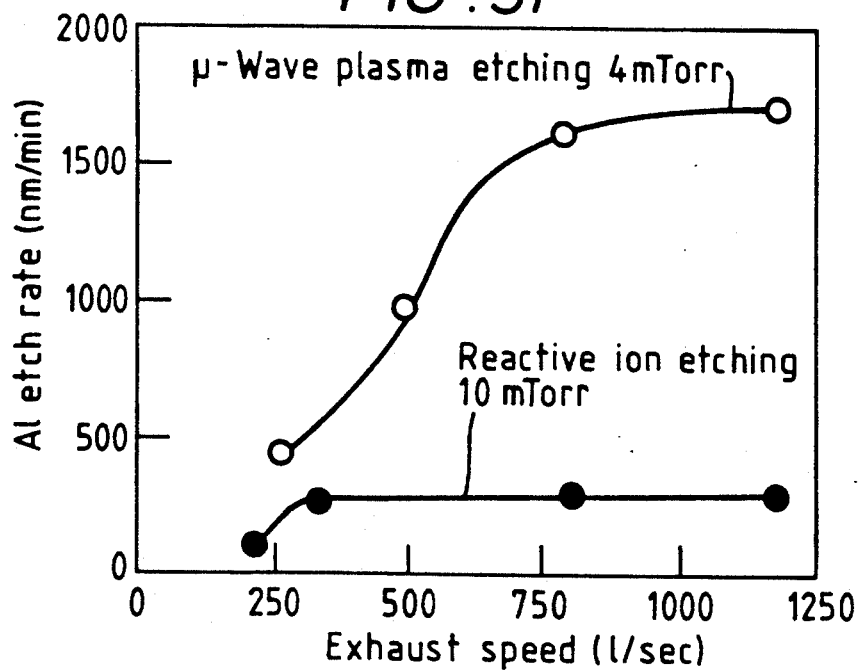
FIG. 31 is a graph of Al etch speed and effective exhaust speed of a particular embodiment of the invention.
Figure 33:
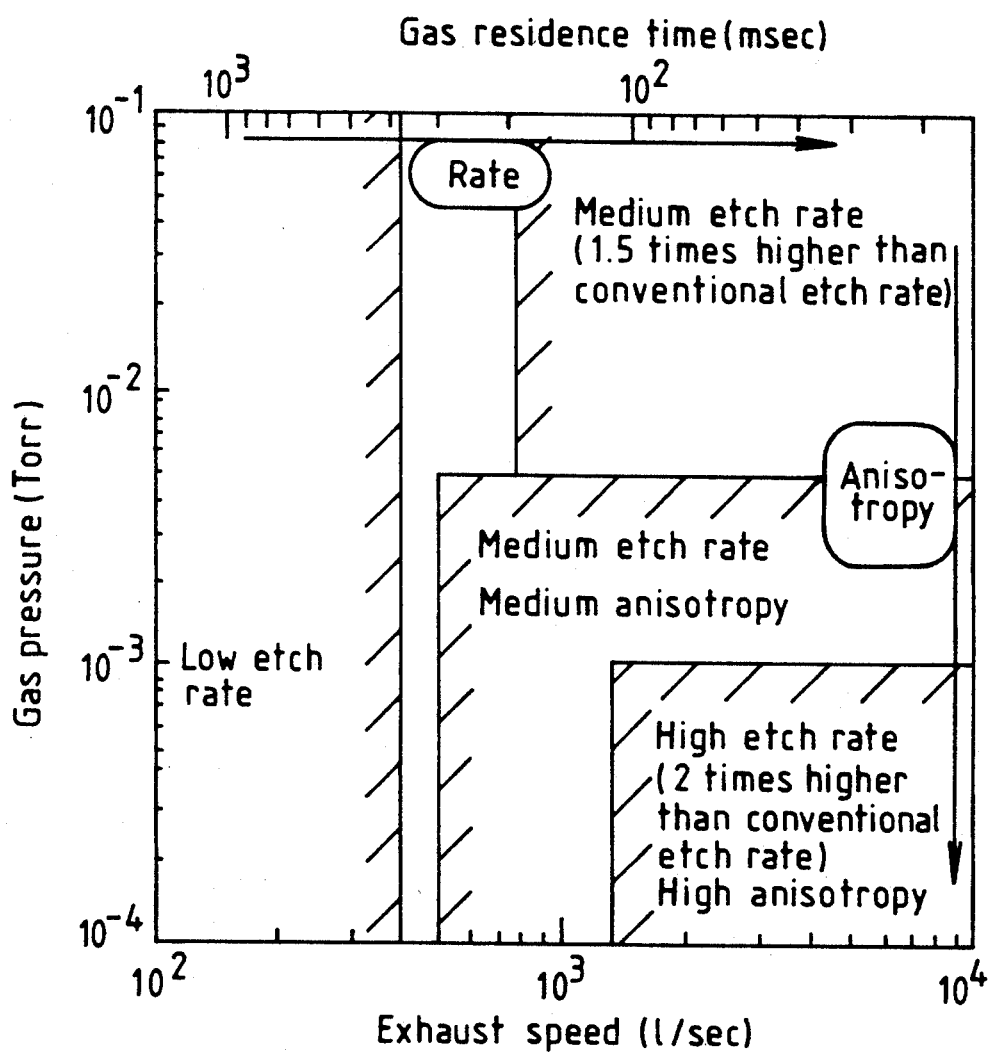
FIG. 33 shows a range of effective exhaust speed and gas pressure to which the effectiveness of the invention is related.

FIG. 31 shows the relationship between Al etch speed and the exhaust speed. The gas pressure was 4 mTorr. As the exhaust speed increased, the Al etch speed in the microwave etching obviously increased compared to that in the reactive ion etching. In microwave etching, the surface reaction speed is faster than that in reactive ion etching when in the so-called reaction rate-determining state, so that the etching reaction is promoted when the etching reactive particles' supply increases due to increases in exhaust speed. Especially, at 500 l/sec or more the etch speed tended toward saturation.

On the other hand, reactive ion etching is in the reaction rate-determining state with a slow surface reaction speed, so that even if the supply of etching reactive particles is increased by increasing the exhaust speed, the etch speed increases only a little. Therefore, in microwave plasma etching, in order to prevent undercuts at low gas pressures and increase the etch speed at high exhaust speeds, it is appropriate to set the gas pressure at 4 mTorr or less, and the exhaust speed at 500 l/sec or more. As the gas pressure goes down, undercuts become fewer; but at 0.5 mTorr or less, Al etch speed greatly drops, becoming 300 nm/min or less, which is not so suitable for practical application.

In a further embodiment using the high speed exhaust microwave plasma etching device shown in FIG. 1 and the reactive ion etching device shown in FIG. 29, Al etching was performed. Etching conditions for the microwave etching device were: 4 mTorr of $Cl_2$ gas pressure, 500 W of microwave power, a 20 W RF bias at 2 MHz, and a 10° C. wafer temperature. Etching conditions for the reactive ion etching device were: 500 W RF power, 10 mTorr of $Cl_2$ gas pressure, and a 10° C. wafer temperature.

Figure 32:
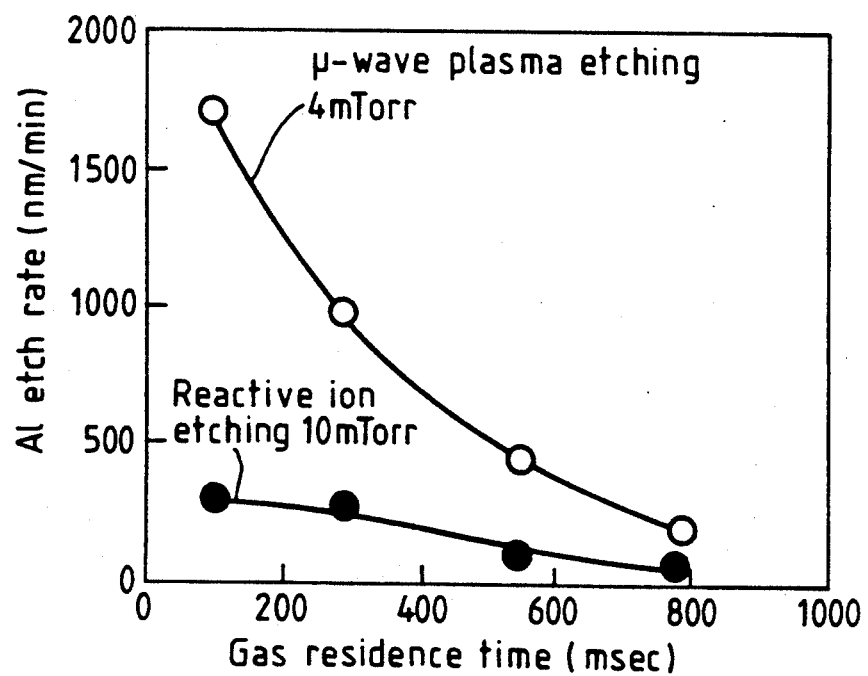
FIG. 32 is a graph of Al etch speed and gas residence time of a particular embodiment of the invention.

FIG. 32 shows the relationship between Al etch speed and gas residence time. Here, the gas flow rate was variable. When there was a reduction in residence time, the Al etch speed tended to increase in both etching methods, but with a more obvious increase in the microwave etching method. At a 300 msec residence time, the Al etch speed was 1000 nm/min. Therefore, in order to obtain a 1000 nm/min etch speed with 0.1 $\mu$m or less undercuts, a 300 msec or less gas residence time at 4 mTorr or less gas pressure was required.

The various embodiments constructed according to the foregoing teachings make possible, under high vacuum of less than 1 mTorr, an increase in gas flow rate to more than 40 sccm while reducing the gas residence time to less than 100 msec. Under these conditions, undercuts are prevented, while a high etch rate at a large gas flow rate and increased etching speed ratio (selectivity ratio) between the etched material and other materials are realized. As a result, high-speed and high-precision etching of silicon trenches and contact holes with high aspect ratios (ratios of pattern width to etching depth) are possible with very high directivity.

Also, it is possible to prevent undercuts to some degree and improve etch speed and etching selectivity even at 1 mTorr or more gas pressure.

Re-deposition of the reaction products is small, which enables reduction in the contamination of the wafer and the device, and reduces abnormalities in the etching form, etc.

The teachings of the invention are effectively applied not only to the above-mentioned etching machines and etching materials, but to other machines and materials, such as magnetron discharge RIE and helical resonator discharge RIE machines, and aluminum, tungsten, tungsten silicide, copper, GaAs, and Si nitride films.

The use of a large vessel allows a number of 8-inch or larger wafers to be etched simultaneously at an etching speed almost equal to that obtained in the conventional machine, while improving the throughput of the plasma treatment and lowering the cost of the semiconductor products.

Batch processing of large-diameter wafers using a large-vessel, high-speed exhaust treatment system increases throughput not only in the dry etching but in other processes as well. Such processes include plasma CVD machines, sputtering machines, ion milling machines, and plasma doping machines.

In any of these systems, as the vacuum chamber becomes large, the amount of residual gas in the vacuum chamber increases, potentially causing problems such as film quality deterioration due to the trapping of residual gas in formed films. Such problems can be reduced by high-speed evacuation, ensuring the formation of quality thin films. The high-speed evacuation makes possible the shortening of the time during which residual gas is reduced to below a specific value, thereby improving the overall process throughput.

Various modifications of the embodiments discussed above may be made without departing from the spirit and scope of the invention, as set forth with greater particularity in the following claims.

We claim:

1. A plasma treatment apparatus, comprising:
   a vacuum chamber having a plasma treatment zone, a gas inlet and a gas outlet;
   means for supporting a body to be treated in the vacuum chamber at a point other than the ECR point;
   means for introducing a gas into the vacuum chamber via the gas inlet;
   means for creating a gas plasma with the gas, and for providing the gas plasma in the plasma treatment zone; and
   exhaust means for evacuating the vacuum chamber through the gas outlet at an effective exhaust speed greater than 500 l/sec.

2. A plasma treatment apparatus as claimed in claim 1, wherein said means for creating a gas plasma includes means for introducing electromagnetic wave radiation.

3. A plasma treatment apparatus as claimed in claim 1, wherein said exhaust means includes variable control valve means for varying the effective exhaust speed of the vacuum chamber.

4. A plasma treatment apparatus as claimed in claim 1, wherein the vacuum chamber further includes means for providing a buffer zone separated from the plasma treatment zone, including a partition having a plurality of openings through which the gas is introduced into the plasma treatment zone.

5. A plasma treatment apparatus as claimed in claim 1, wherein the gas introducing means includes at least one gas inlet pipe connected to the vacuum chamber and through which gas is introduced, and wherein the vacuum chamber includes a number of gas inlets operably associated with and corresponding to the number of gas inlet pipes, said gas inlets each being located at a point of connection between its associated gas inlet pipe and the vacuum chamber, and wherein the vacuum chamber includes means for providing a buffer zone separated from the plasma treatment zone for each gas inlet, each said buffer zone partition having a plurality of openings through which the gas is introduced into the plasma treatment zone from the buffer zone.

6. A plasma treatment apparatus as claimed in claim 5, wherein said gas introducing means includes a single gas source for supplying gas to all said gas inlets.

7. A plasma treatment apparatus as claimed in claim 4, further comprising a plurality of gas inlet pipes connected to the buffer zone and through which gas is supplied to the buffer zone, and a single gas source operably connected to all said gas inlet pipes.

8. A plasma treatment apparatus as claimed in claim 4, further comprising a plurality of gas inlet pipes connected to the buffer zone and through which gas is supplied to the buffer zone, and a plurality of gas sources for supplying gas to said gas inlet pipes, at least one said gas source being operably provided for each said gas inlet pipe.

9. A plasma treatment apparatus as claimed in claim 4, wherein said supporting means includes a table for supporting a body to be treated within the vacuum chamber, and wherein the buffer zone and the partition are located vertically above the table so that the gas is introduced through the partition in a direction substantially perpendicular to a plane containing the table.

10. A plasma treatment apparatus as claimed in claim 1, wherein the supporting means includes a table for supporting a body to be treated within the vacuum chamber, said table having an aperture in a substantially central portion thereof, through which the exhaust means evacuates the vacuum chamber.

11. A plasma treatment apparatus as claimed in claim 10, wherein the table further includes at least one additional aperture through which the exhaust means evacuates the vacuum chamber.

12. A plasma treatment method, comprising the steps of:
providing a body to be treated in a vacuum chamber;
introducing a gas into the vacuum chamber;
producing a gas plasma with the introduced gas;
treating the body with the gas plasma; and
evacuating the vacuum chamber using n exhaust gas systems at an effective exhaust speed S greater than 800 l/sec, wherein the effective exhaust speed S is defined according to the formula:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, and n is a positive integer.

13. A plasma treatment method as claimed in claim 12, further comprising the step of varying the effective exhaust speed during evacuation.

14. A plasma treatment method as claimed in claim 12, wherein said treating step is an etching step carried out at an etching speed of at least 50 nm/min, and said evacuating step is conducted at an effective exhaust speed greater than 500 l/sec so that the residence time of the gas in the vacuum chamber does not substantially exceed 300 msec.

15. A plasma treatment method as claimed in claim 12, wherein said introducing step is carried out so that a gas pressure of the gas in the vacuum chamber does not exceed 5 mTorr.

16. A plasma treatment method as claimed in claim 12, wherein the introducing step is carried out so that a gas pressure of the gas in the vacuum chamber does not exceed 1 mTorr.

17. A plasma treatment method as claimed in claim 12, wherein said evacuating step is carried out so that the residence time of the gas in the vacuum chamber does not substantially exceed 100 msec.

18. A plasma treatment method as claimed in claim 12, wherein the introducing step is carried out so that a flow velocity of the introduced gas is less than one-third the speed of sound in the vacuum chamber.

19. A plasma treatment method as claimed in claim 12, wherein the introducing step is carried out so that a gas pressure of the gas does not exceed 0.5 mTorr.

20. A plasma treatment method as claimed in claim 12, wherein the evacuating step is carried out so that the residence time of the gas in the vacuum chamber does not exceed 50 msec.

21. A plasma treatment method as claimed in claim 12, wherein the introducing step is carried out so that the flow rate of the introduced gas is at least 40 sccm.

22. A plasma treatment method as claimed in claim 12, wherein the evacuating step is carried out so that the effective exhaust speed is at least 1300 l/sec.

23. A plasma treatment method as claimed in claim 12, wherein the evacuating step is carried out so that the effective exhaust speed is at least 2000 l/sec.

24. A plasma treatment method as claimed in claim 12, wherein the introducing step is carried out so that the flow rate of the introduced gas is at least 100 sccm.

25. A plasma treatment apparatus as claimed in claim 1, further comprising means for producing a magnetic field in the plasma treatment zone for enhancing the gas plasma formed therein.

26. A plasma treatment apparatus as claimed in claim 1, wherein said means for creating a plasma includes a source of high-frequency radiation.

27. A plasma treatment apparatus, comprising:
a vacuum chamber having an internal plasma treatment zone, a gas inlet and a gas outlet;
means for introducing a gas into the vacuum chamber;
means for producing a gas plasma with the gas, and for providing the gas plasma in the plasma treatment zone; and
means, including n exhaust gas systems for evacuating the vacuum chamber at an effective exhaust speed S greater than 800 l/sec, wherein the effective exhaust speed S is defined according to the formula:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, and n is a positive integer.

28. A plasma treatment apparatus as claimed in claim 27, wherein said means for producing a gas plasma includes means for introducing electromagnetic wave radiation.

29. A plasma treatment apparatus as claimed in claim 27, wherein said exhaust means includes variable control valve means for varying the speed of evacuation of the vacuum chamber.

30. A plasma treatment apparatus as claimed in claim 27, wherein the vacuum chamber further includes means for providing a buffer zone separated from the discharge zone, including a partition having a plurality of openings through which the gas is introduced into the plasma treatment zone.

31. A plasma treatment apparatus as claimed in claim 27, wherein the gas introducing means includes at least one gas inlet pipe connected to the vacuum chamber and through which gas is introduced, and wherein the vacuum chamber includes a number of gas inlets operably associated with and corresponding to the number of gas inlet pipes, said gas inlets each being located at a point of connection between its associated gas inlet pipe and the vacuum chamber, and wherein the vacuum chamber includes means for providing a buffer zone separated from the plasma treatment zone for each gas inlet, each said buffer zone partition having a plurality of openings through which the gas is introduced into the plasma treatment zone from the buffer zone.

32. A plasma treatment apparatus as claimed in claim 31, wherein said gas introducing means includes a single gas source for supplying gas to all gas inlets.

33. A plasma treatment apparatus as claimed in claim 30, further comprising a plurality of gas inlet pipes connected to the buffer zone and through which gas is supplied to the buffer zone, and a single gas source operably connected to all said gas inlet pipes.

34. A plasma treatment apparatus as claimed in claim 30, further comprising a plurality of gas inlet pipes connected to the buffer zone and through which gas is supplied to the buffer zone, and a plurality of gas sources for supplying gas to said gas inlet pipes, at least one said gas source being operably provided for each said gas inlet pipe.

35. A plasma treatment apparatus as claimed in claim 30, further comprising means for supporting a body to be treated in the vacuum chamber, wherein said supporting means includes a table for supporting a body to be treated within the vacuum chamber, and wherein the buffer zone and the partition are located vertically above the table so that the gas is introduced through the partition in a direction substantially perpendicular to a plane containing the table.

36. A plasma treatment apparatus as claimed in claim 27, further comprising means for supporting a body to be treated in the vacuum chamber, wherein the supporting means includes a table for supporting a body to be treated within the vacuum chamber, said table having an aperture in a substantially central portion thereof, through which the exhaust means evacuates the vacuum chamber.

37. A plasma treatment apparatus as claimed in claim 36, wherein the table further includes at least one additional aperture through which the exhaust means evacuates the vacuum chamber.

38. A plasma treatment apparatus, comprising:
a vacuum chamber having an internal plasma treatment zone, a gas inlet and a gas outlet;
means for supporting a body to be treated within the vacuum chamber;
means for introducing a gas into the vacuum chamber;
means for producing a gas plasma with the introduced gas; and
means for evacuating the vacuum chamber using n exhaust gas systems at an effective exhaust speed S greater than 500 l/sec, wherein the effective exhaust speed S is defined according to the formula:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, and n is a positive integer, so that the residence time of the gas in the vacuum chamber does not substantially exceed 300 msec;
wherein said gas plasma etches the body to be treated at an etching speed greater than or equal to 50 nm/min.

39. A plasma treatment apparatus, comprising:
a vacuum chamber having an internal plasma treatment zone, a gas inlet and a gas outlet;
means for introducing a gas into the vacuum chamber so that a gas pressure less than or equal to 5 mTorr is provided within the vacuum chamber;
means for producing a gas plasma with the introduced gas; and
means for evacuating the vacuum chamber using n exhaust gas systems at an effective exhaust speed S greater than 800 l/sec, wherein the effective exhaust speed S is defined according to the formula:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, and n is a positive integer.

40. A plasma treatment method, comprising the steps of:
providing a body to be treated in a vacuum chamber at a location other than an ECR point;
introducing a gas into the vacuum chamber;
producing a gas plasma with the introduced gas;
treating the body with the gas plasma; and
evacuating the vacuum chamber using n exhaust gas systems at an effective exhaust speed S greater than 500 l/sec, wherein the effective exhaust speed S is defined according to the formula:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, and n is a positive integer.

41. A plasma treatment method as claimed in claim 40, further comprising the step of varying the effective exhaust speed during evacuation.

42. A plasma treatment method as claimed in claim 40, wherein said treating step is an etching step carried out at an etching speed of at least 50 nm/min, and said evacuating step is conducted so that the residence time of the gas in the vacuum chamber does not substantially exceed 300 msec.

43. A plasma treatment method as claimed in claim 40, wherein said introducing step is carried out so that a gas pressure of the gas in the vacuum chamber does not exceed 5 mTorr.

44. A plasma treatment method as claimed in claim 40, wherein the introducing step is carried out so that a gas pressure of the gas in the vacuum chamber does not exceed 1 mTorr.

45. A plasma treatment method as claimed in claim 40, wherein said evacuating step is carried out so that the residence time of the gas in the vacuum chamber does not substantially exceed 100 msec.

46. A plasma treatment method as claimed in claim 40, wherein the introducing step is carried out so that a flow velocity of the introduced gas is less than one-third the speed of sound in the vacuum chamber.

47. A plasma treatment method as claimed in claim 40, wherein the introducing step is carried out so that a gas pressure of the gas does not exceed 0.5 mTorr.

48. A plasma treatment method as claimed in claim 40, wherein the evacuation step is carried out so that the residence time of the gas in the vacuum chamber does not exceed 50 msec.

49. A plasma treatment method as claimed in claim 40, wherein the introducing step is carried out so that the flow rate of the introduced gas is at least 40 sccm.

50. A plasma treatment method as claimed in claim 40, wherein the evacuating step is carried out so that the effective exhaust speed is at least 1300 l/sec.

51. A plasma treatment method as claimed in claim 40, wherein the evacuating step is carried out so that the effective exhaust speed is at least 2000 l/sec.

52. A plasma treatment method as claimed in claim 40, wherein the introducing step is carried out so that the flow rate of the introduced gas is at least 100 sccm.

53. A plasma treatment method, comprising the steps of:
providing a body to be treated in a vacuum chamber;
introducing a gas into the vacuum chamber;
producing a gas plasma with the introduced gas;
etching the body with the gas plasma at an etching speed greater than or equal to 50 nm/min; and
evacuating the vacuum chamber using n exhaust has systems at an effective exhaust speed S greater than 500 l/sec,
wherein the effective exhaust speed S is defined according to the formula:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, so that the residence time of the gas in the vacuum chamber does not substantially exceed 300 msec.

54. A plasma treatment method, comprising the steps of:
providing a body to be treated in a vacuum chamber;
introducing a gas into the vacuum chamber so that the gas pressure in the vacuum chamber is less than or equal to 5 mTorr;
producing a gas plasma with the introduced gas;
treating the body to be treated with the gas plasma; and
evacuating the vacuum chamber using n exhaust has systems at an effective exhaust speed S greater than 800 l/sec, wherein the effective exhaust speed S is defined according to the formula:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, and n is a positive integer.

55. A plasma treatment apparatus as claimed in claim 1, wherein the ratio of height to width of the vacuum chamber is 0.5 or greater.

56. A plasma treatment apparatus as claimed in claim 25, wherein the ratio of height to width of the vacuum chamber is 0.5 or greater.

57. A plasma treatment apparatus as claimed in claim 1, wherein the gas inlet is located within the top one-third of the height of the discharge zone.

58. A plasma treatment apparatus as claimed in claim 25, wherein the gas inlet is located within the top one-third of the height of the discharge zone.

59. A plasma treatment apparatus as claimed in claim 1, further comprising means for controlling the gas flow rate into the vacuum chamber to be greater than or equal to 40 sccm.

60. A plasma treatment apparatus as claimed in claim 25, further comprising means for controlling the gas flow rate into the vacuum chamber to be greater than or equal to 40 sccm.

61. A plasma treatment apparatus as claimed in claim 1, wherein said supporting means includes a table having a surface area of greater than 5000 cm$^2$.

62. A plasma treatment apparatus as claimed in claim 25, wherein said supporting means includes a table having a surface area of greater than 5000 cm$^2$.

63. A plasma treatment apparatus as claimed in claim 1, wherein the means for introducing gas includes gas flow rate control means for controlling the flow rate of the gas to be greater than 100 sccm.

64. A plasma treatment apparatus as claimed in claim 25, wherein the means for introducing gas includes gas flow rate control means for controlling the flow rate of the gas to be greater than 100 sccm.

65. A plasma treatment apparatus as claimed in claim 2, wherein said means for introducing electromagnetic wave radiation includes a source of microwave radiation.

66. A plasma treatment apparatus as claimed in claim 28, wherein said means for introducing electromagnetic wave radiation includes a source of microwave radiation.

67. A plasma treatment apparatus as claimed in claim 26, wherein said supporting means includes a table having a surface area of greater than 5000 cm$^2$.

68. A plasma treatment apparatus as claimed in claim 1, wherein the exhaust means includes a plurality of pumps installed in the vacuum chamber.

69. A plasma treatment apparatus as claimed in claim 27, wherein the evacuating means includes a plurality of pumps installed in the vacuum chamber.

70. A plasma treatment apparatus as claimed in claim 68, wherein the plurality of pumps are installed symmetrically with respect to an axis of the body to be treated in the vacuum chamber, and wherein the vacuum chamber further has an exhaust buffer zone connecting the plurality of pumps and the plasma treatment zone, said exhaust buffer zone being arranged symmetrically with respect to the body axis.

71. A plasma treatment apparatus as claimed in claim 70, wherein each said pump has an exhaust speed greater than or equal to 500 l/sec, so that the total exhaust speed $\Sigma S_i$ is greater than or equal to 2000 l/sec.

72. A plasma treatment apparatus as claimed in claim 27, wherein the plurality of pumps are installed symmetrically with respect to an axis of the body to be treated in the vacuum chamber, and wherein the vacuum chamber further has an exhaust buffer zone connecting the plurality of pumps and the plasma treatment zone, said exhaust buffer zone being arranged symmetrically with respect to the body axis.

73. A plasma treatment apparatus as claimed in claim 1, wherein the effective exhaust speed S for an apparatus having n exhaust systems is expressed by the following equation:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, and n is a positive integer;

and wherein the effective exhaust speed is at least $\frac{2}{3}$ the total exhaust speed $\Sigma S_n$.

74. A plasma treatment apparatus as claimed in claim 25, wherein the effective exhaust speed S for an apparatus having n exhaust systems is expressed by the following equation:

$$\frac{1}{S} = \frac{1}{\sum_{i=1}^{n} S_i} + \frac{1}{C}$$

where $S_i$ is the exhaust speed of the $i^{th}$ exhaust system, C is the exhaust conductance of the vacuum chamber, and n is a positive integer;

and wherein the effective exhaust speed is at least $\frac{2}{3}$ the total exhaust speed $\Sigma S_n$.

75. A plasma treatment apparatus as claimed in claim 1, wherein the plasma treatment zone has a top diameter and a bottom diameter which is larger in magnitude than the top diameter, and wherein the supporting means supports the body below the plasma treatment zone during plasma treatment.

76. A plasma treatment apparatus as claimed in claim 53, wherein the effective exhaust speed S is greater than or equal to 800 l/sec.

* * * * *